US012282061B2

(12) United States Patent
Yamaguchi et al.

(10) Patent No.: US 12,282,061 B2
(45) Date of Patent: Apr. 22, 2025

(54) WAFER TEST SYSTEM, PROBE CARD REPLACING METHOD, AND PROBER

(71) Applicant: Tokyo Seimitsu Co., Ltd., Tokyo (JP)

(72) Inventors: Akira Yamaguchi, Tokyo (JP); Yuta Sato, Tokyo (JP); Naoki Kasai, Tokyo (JP); Naoyuki Yamazoe, Tokyo (JP); Tetsuya Yasunaka, Tokyo (JP); Kazuma Takii, Tokyo (JP); Teppei Aoki, Tokyo (JP); Wataru Kawasaki, Tokyo (JP); Hiroki Ishida, Tokyo (JP); Yasuhito Iguchi, Tokyo (JP)

(73) Assignee: TOKYO SEIMITSU CO., LTD., Tokyo (JP)

( * ) Notice: Subject to any disclaimer, the term of this patent is extended or adjusted under 35 U.S.C. 154(b) by 0 days.

(21) Appl. No.: 18/774,727

(22) Filed: Jul. 16, 2024

(65) Prior Publication Data

US 2024/0369623 A1    Nov. 7, 2024

Related U.S. Application Data

(63) Continuation of application No. PCT/JP2022/045617, filed on Dec. 12, 2022.

(30) Foreign Application Priority Data

Jan. 17, 2022 (JP) ................. 2022-005019

(51) Int. Cl.
  *G01R 31/28* (2006.01)
  *G01R 1/04* (2006.01)
  *G01R 1/073* (2006.01)

(52) U.S. Cl.
  CPC ....... *G01R 31/2887* (2013.01); *G01R 1/0491* (2013.01); *G01R 1/07314* (2013.01); *G01R 31/2893* (2013.01)

(58) Field of Classification Search
  CPC .......... G01R 1/04; G01R 1/073; G01R 31/28; G01R 1/049; G01R 1/07314;
  (Continued)

(56) References Cited

U.S. PATENT DOCUMENTS

2004/0164756 A1    8/2004  Suzuki
2007/0262783 A1    11/2007 Hosaka et al.
(Continued)

FOREIGN PATENT DOCUMENTS

JP    5-136219 A     6/1993
JP    2007-198971 A  8/2007
(Continued)

OTHER PUBLICATIONS

International Search Report for PCT/JP2022/045617 (PCT/ISA/210) mailed on Mar. 14, 2023.
(Continued)

*Primary Examiner* — Alesa Allgood
*Assistant Examiner* — Courtney G McDonnough
(74) *Attorney, Agent, or Firm* — Birch, Stewart, Kolasch & Birch, LLP

(57) ABSTRACT

The wafer test system includes: a prober including a chuck that holds a semiconductor wafer and a probe card having probe needles thereon, and brings the probe needles in contact with semiconductor chips formed on the semiconductor wafer to inspect the semiconductor chips; an overhead hoist transport that delivers the cassette that houses the plurality of semiconductor wafers to be inspected to the prober and withdraws, from the prober, the cassette that houses the semiconductor wafers that have been inspected; a conveying control unit that controls the overhead hoist transport to convey the probe card between a replacement position of the probe card predetermined in the prober and a storage of the probe card located in a place different from
(Continued)

the prober; and a card conveying mechanism that conveys the probe card between a holding position in the prober and the replacement position.

11 Claims, 34 Drawing Sheets

(58) Field of Classification Search
CPC ............ G01R 31/2887; G01R 31/2893; H01L 21/67253; H01L 21/677; H01L 21/67721; H01L 21/6773; H01L 21/6831; H01L 22/00
See application file for complete search history.

(56) References Cited

U.S. PATENT DOCUMENTS

| | | |
|---|---|---|
| 2020/0011927 A1 | 1/2020 | Kagami |
| 2020/0088788 A1 | 3/2020 | Wang et al. |

FOREIGN PATENT DOCUMENTS

| | | |
|---|---|---|
| JP | 2007-329458 A | 12/2007 |
| TW | 202012938 A | 4/2020 |

OTHER PUBLICATIONS

Taiwanese Office Action issued in TW patent application No. 112100970 dated May 30, 2024.
Written Opinion of the International Searching Authority for PCT/JP2022/045617 (PCT/ISA/237) mailed on Mar. 14, 2023.

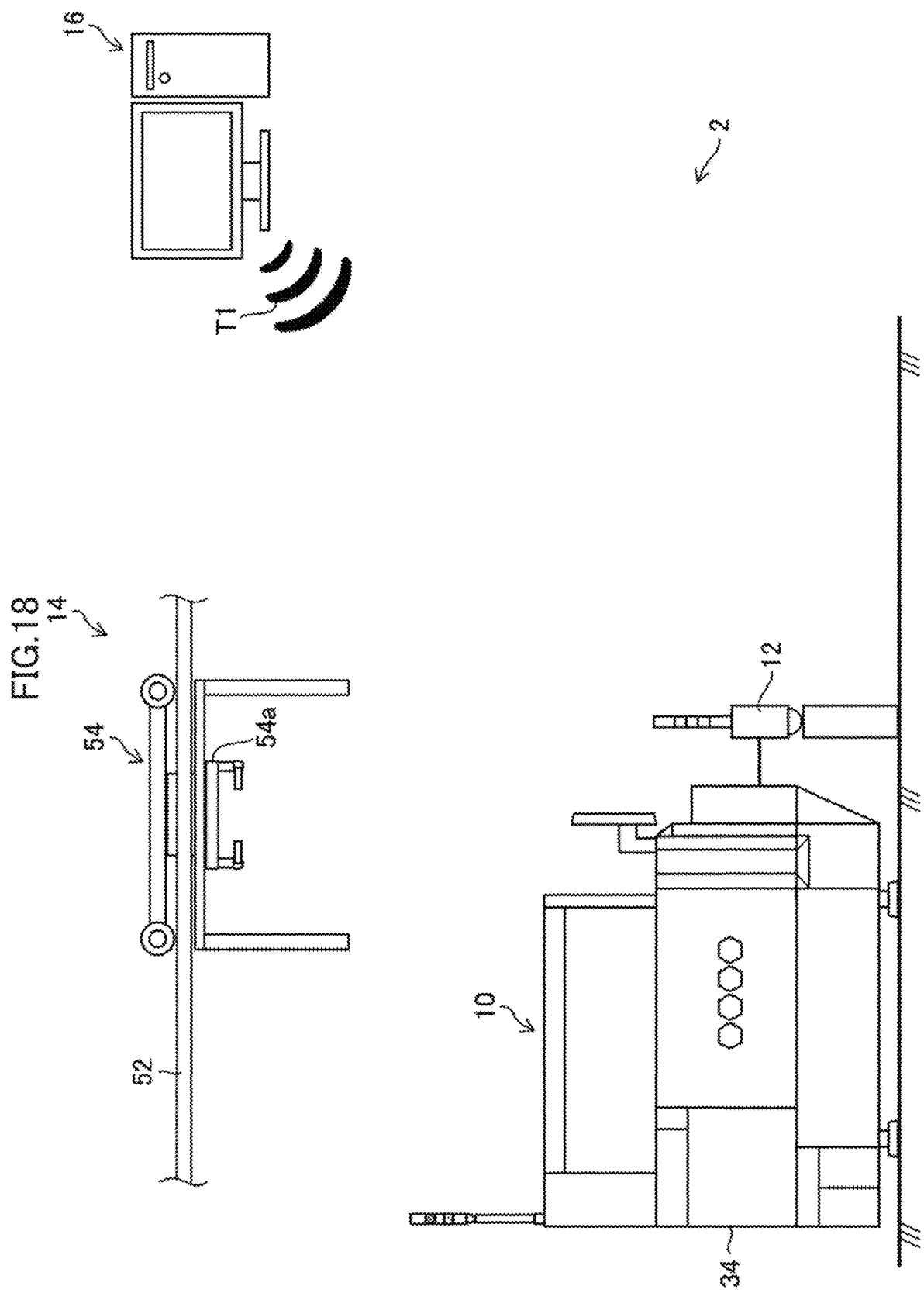

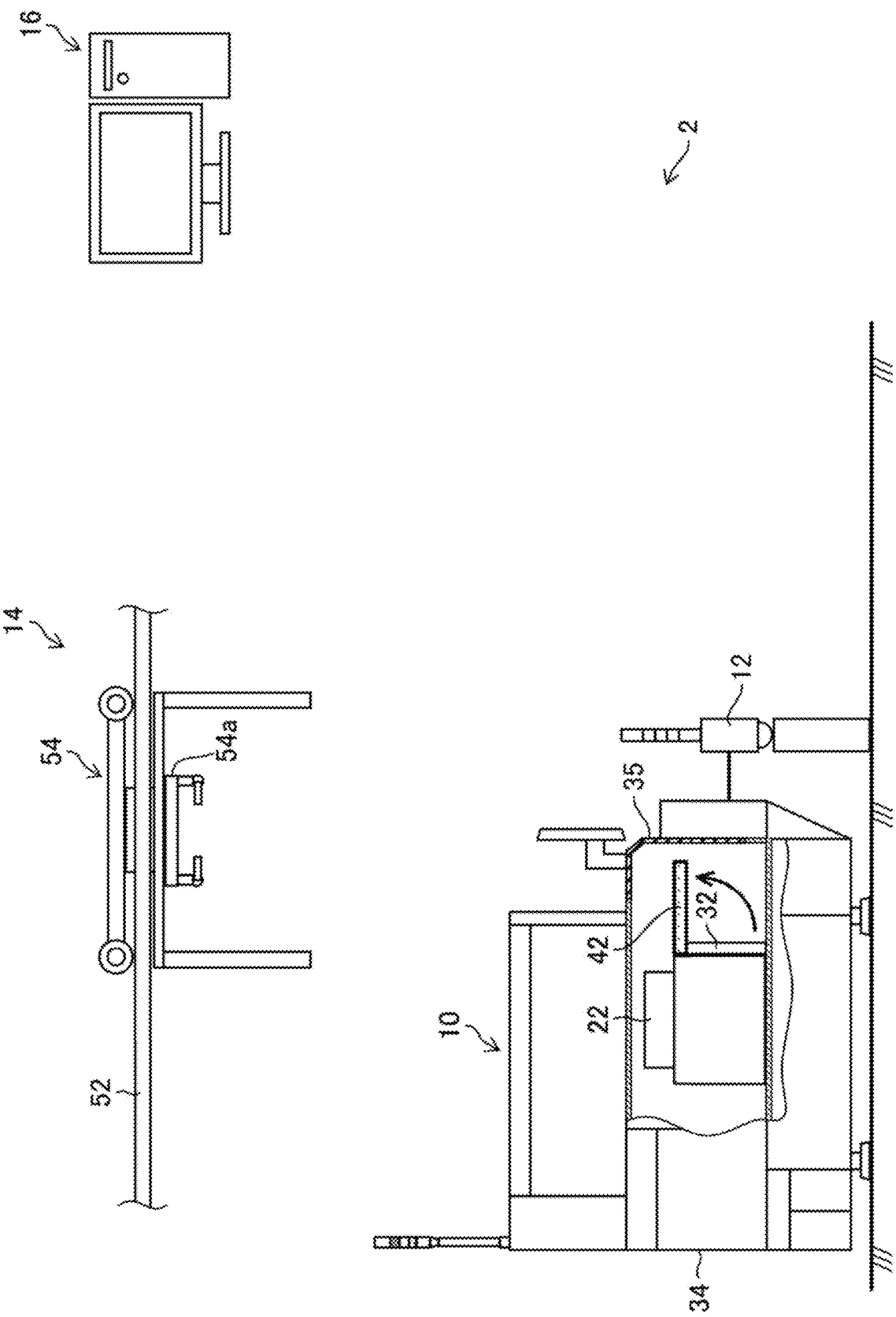

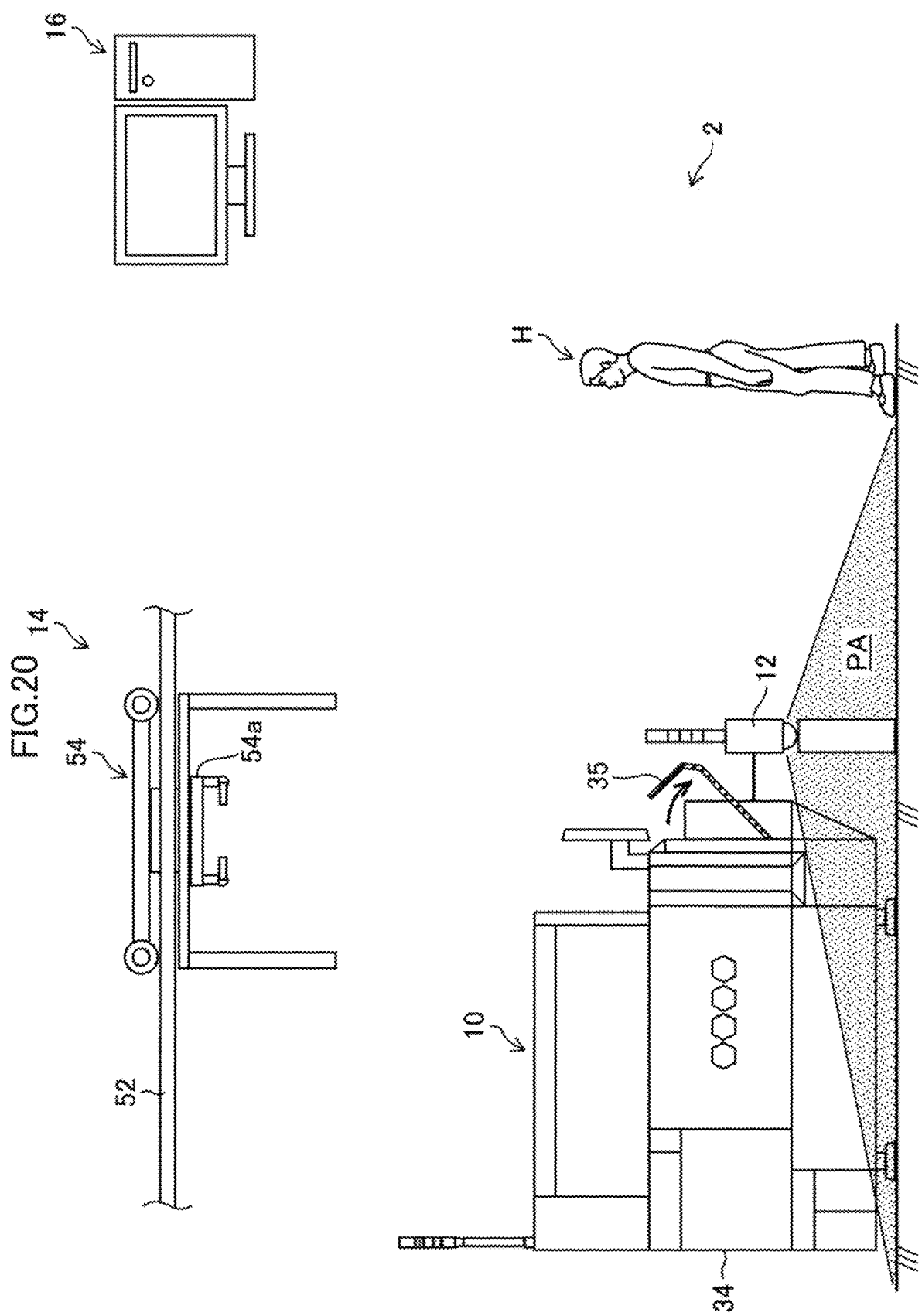

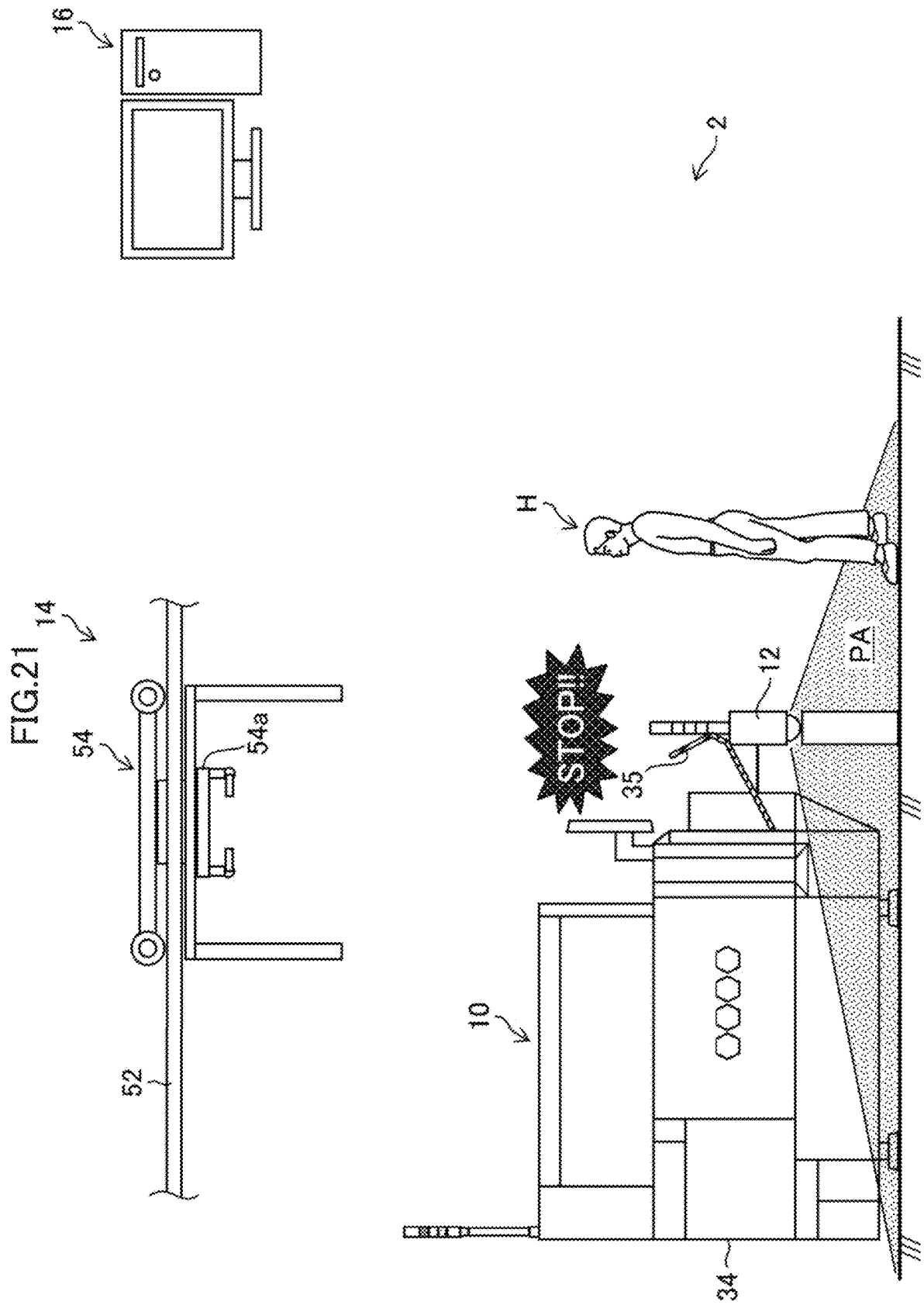

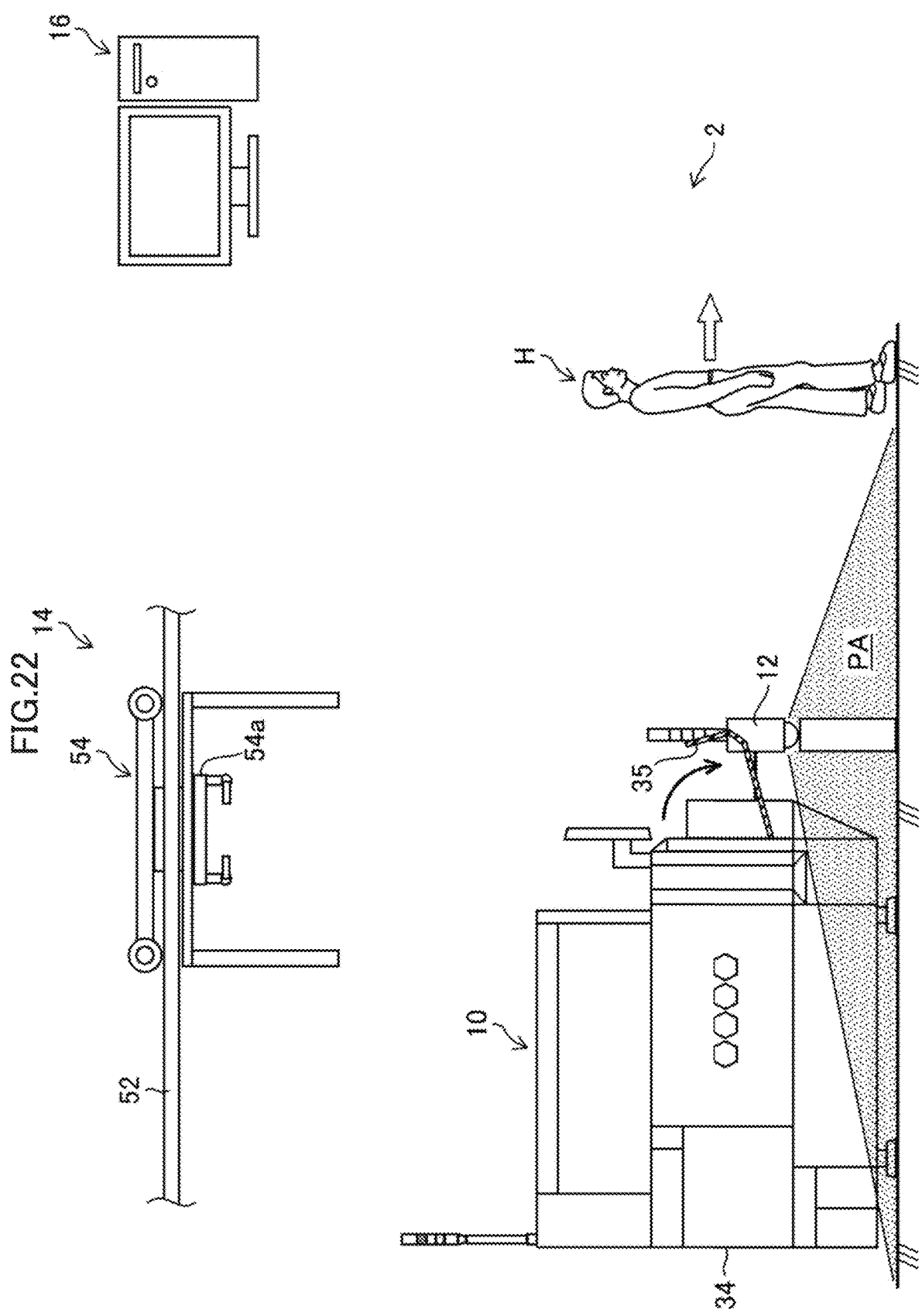

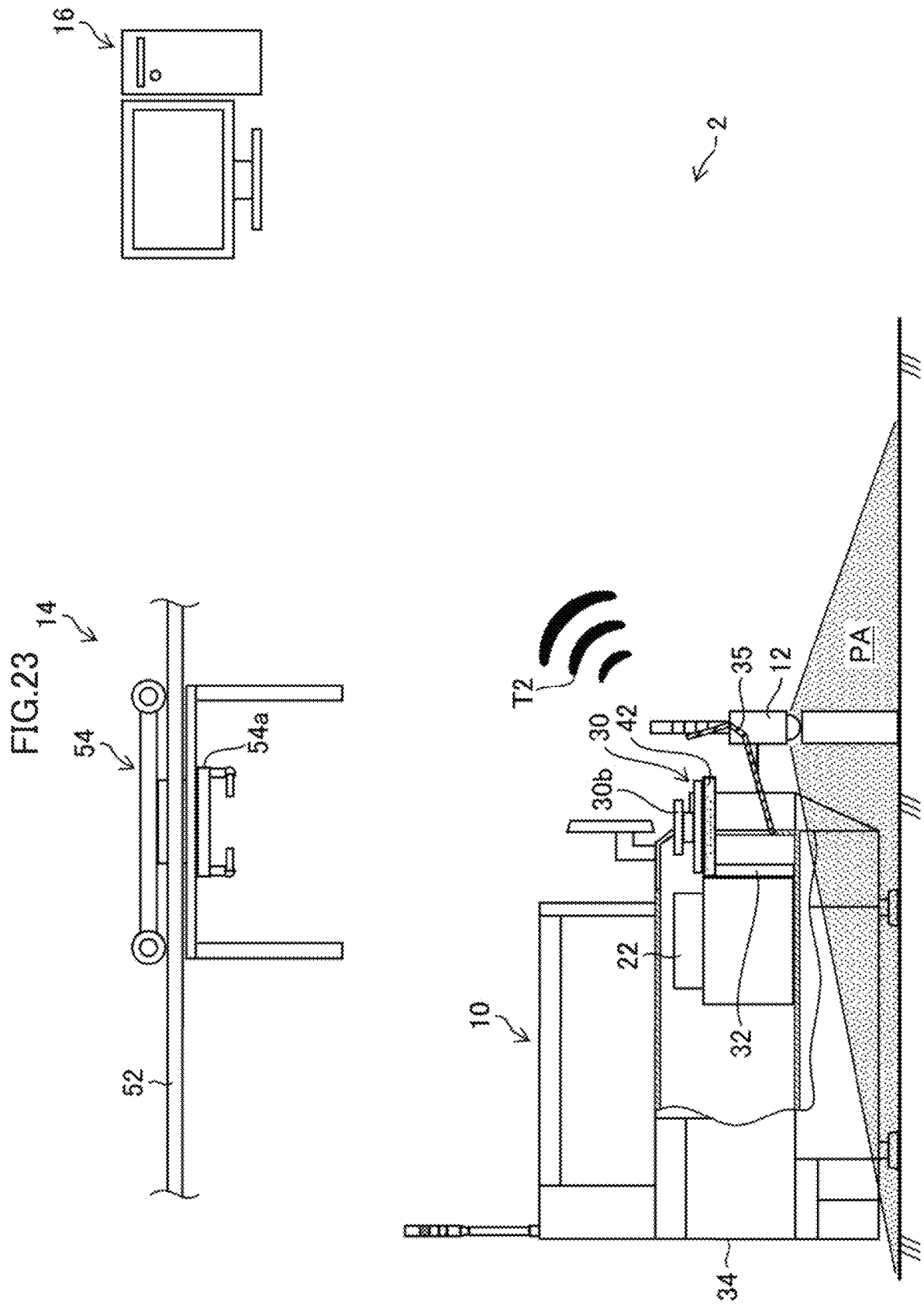

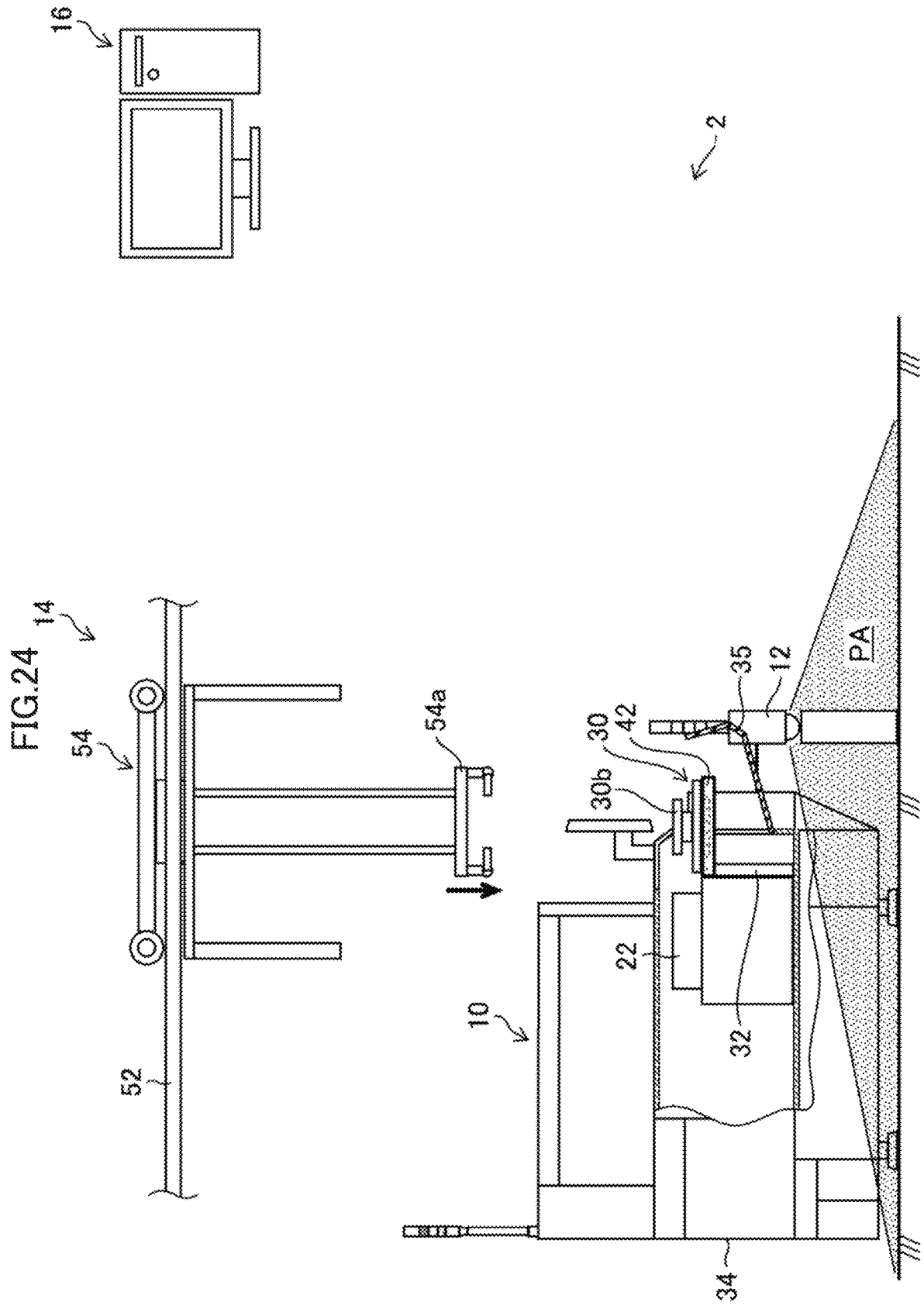

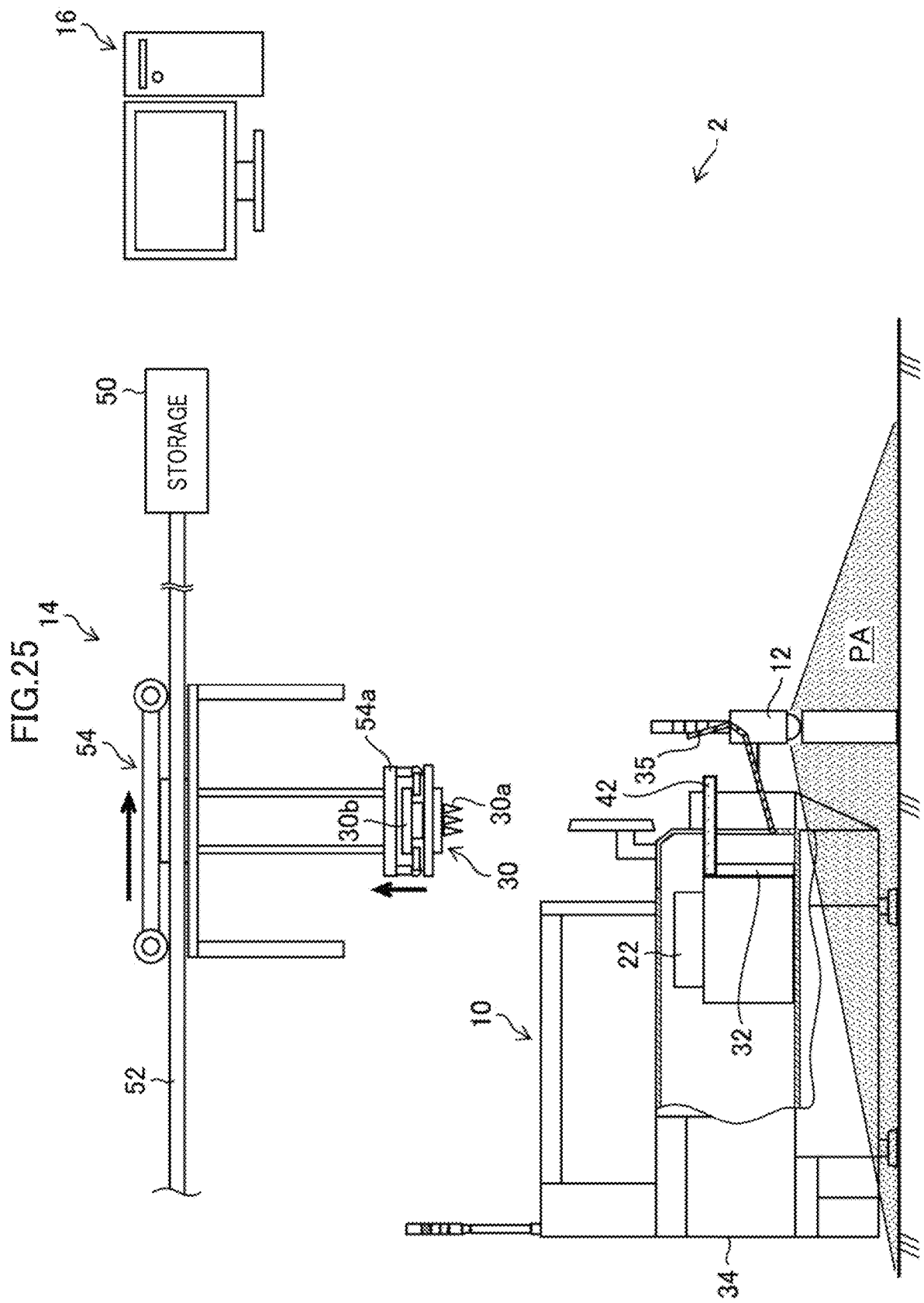

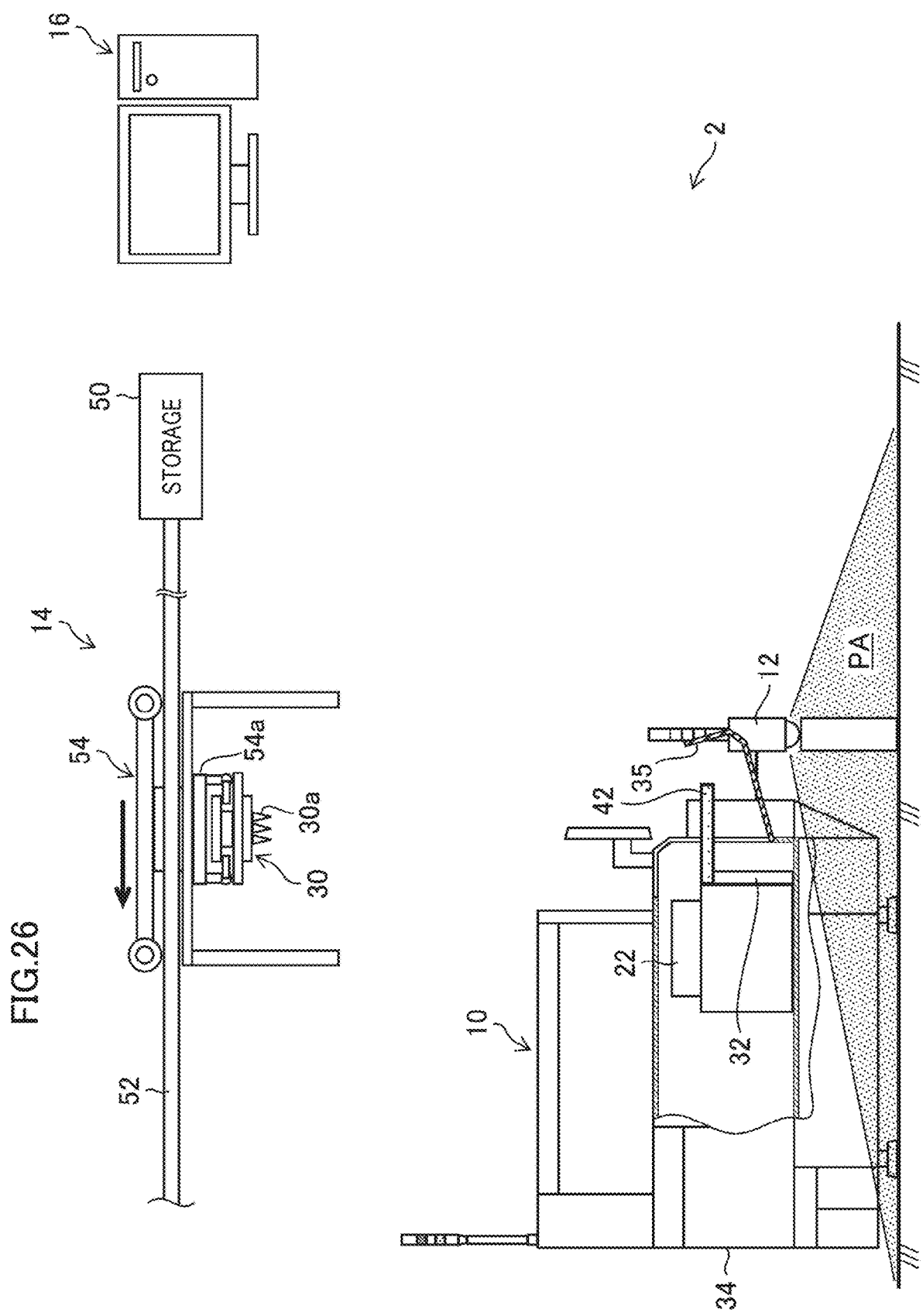

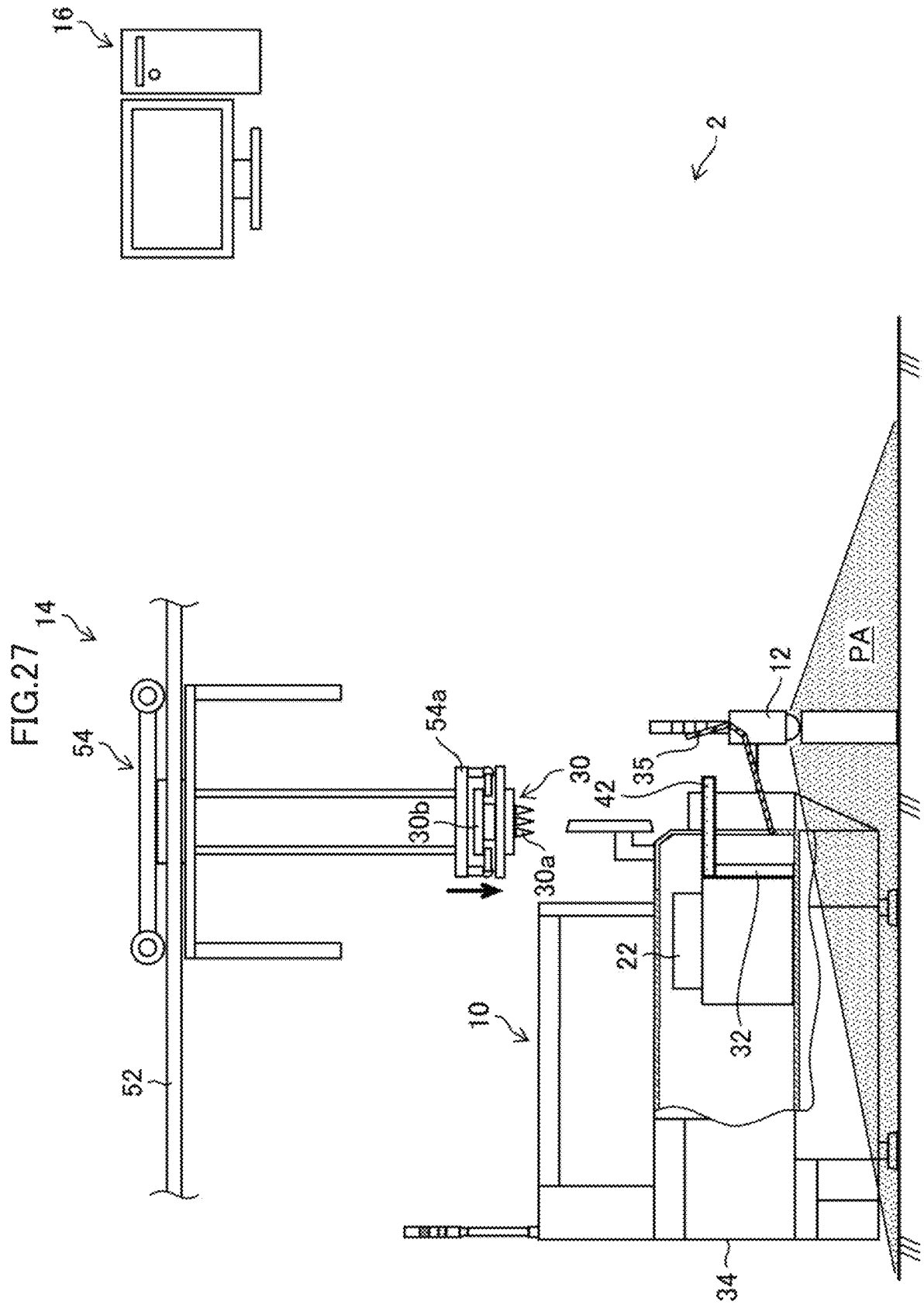

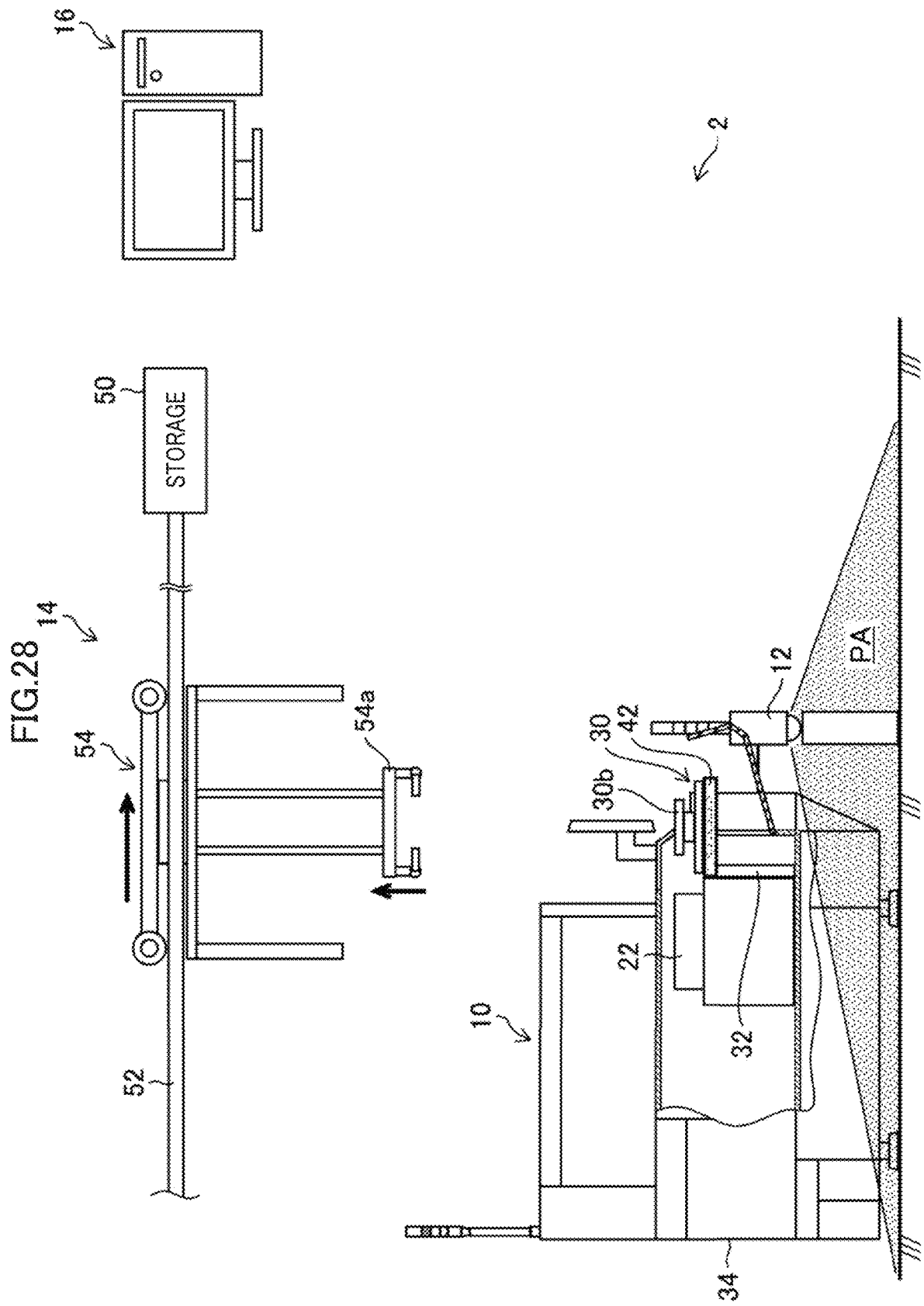

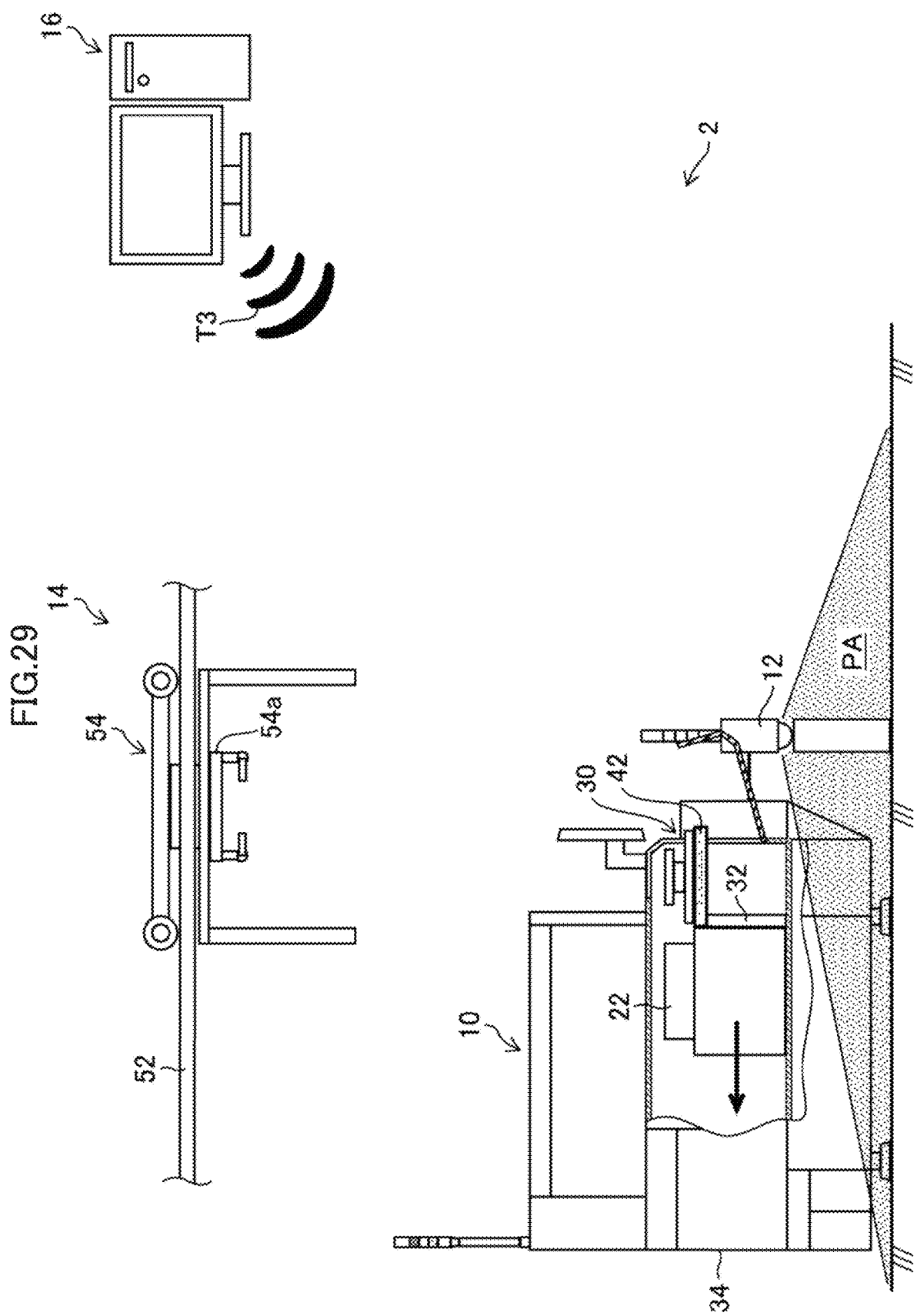

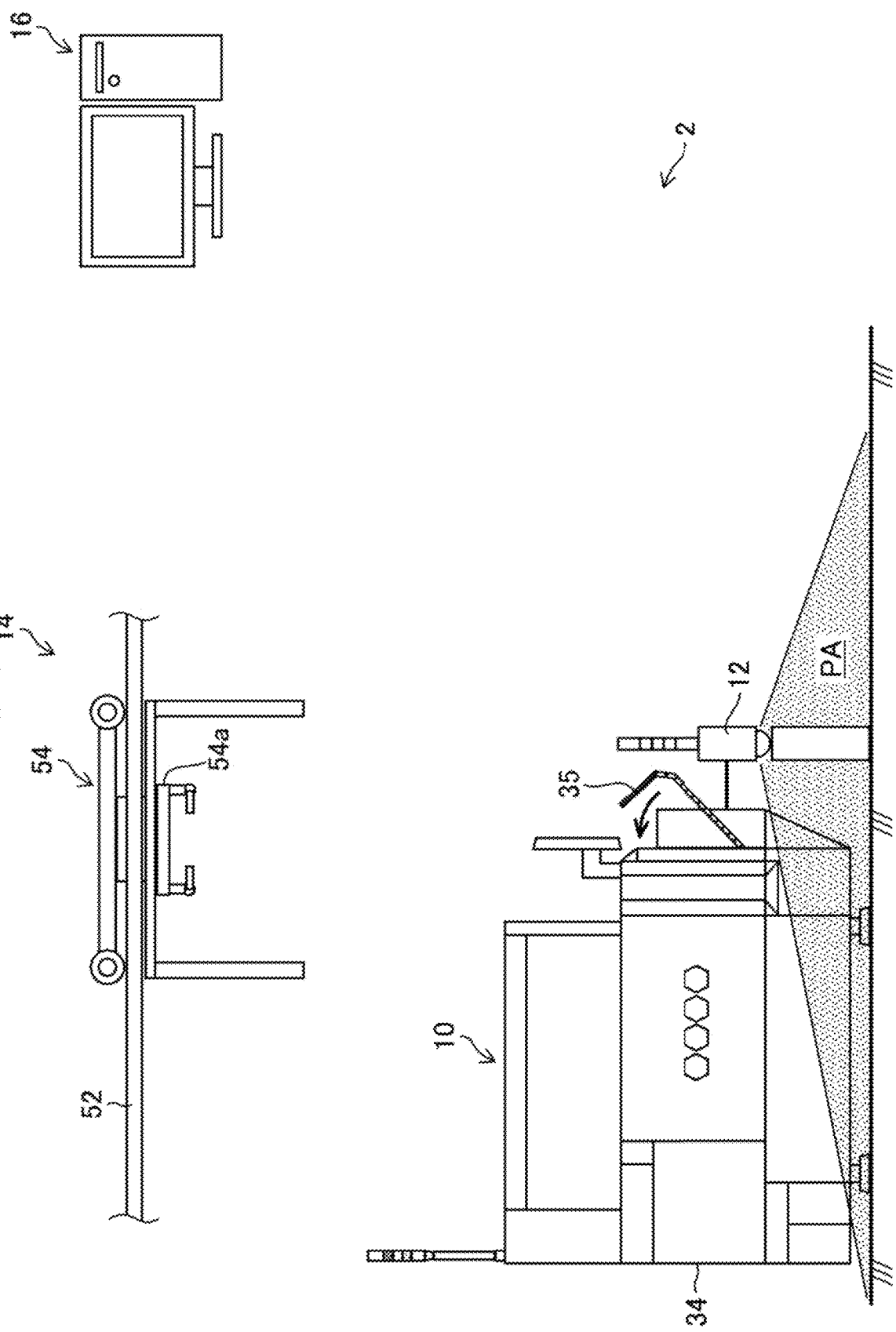

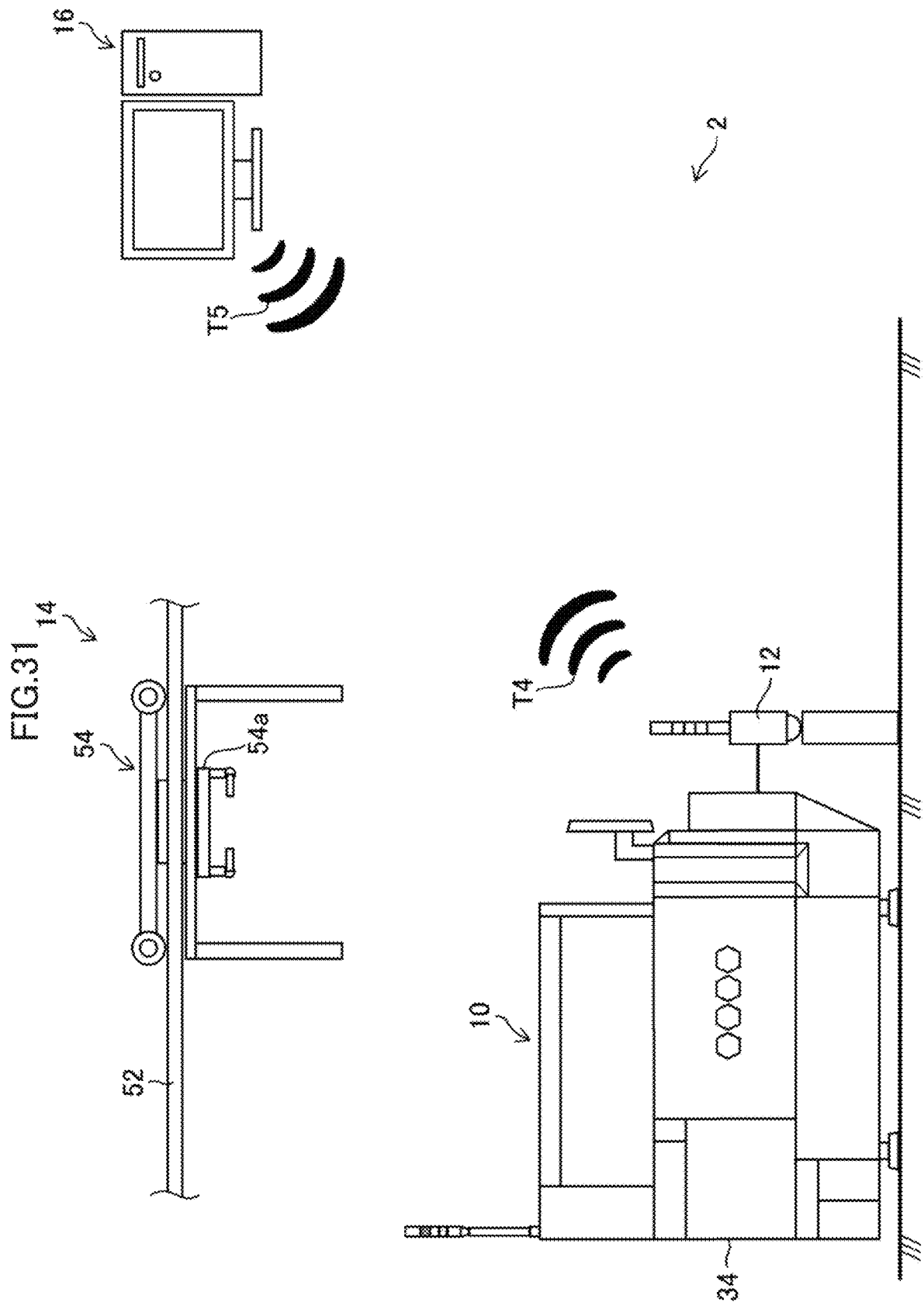

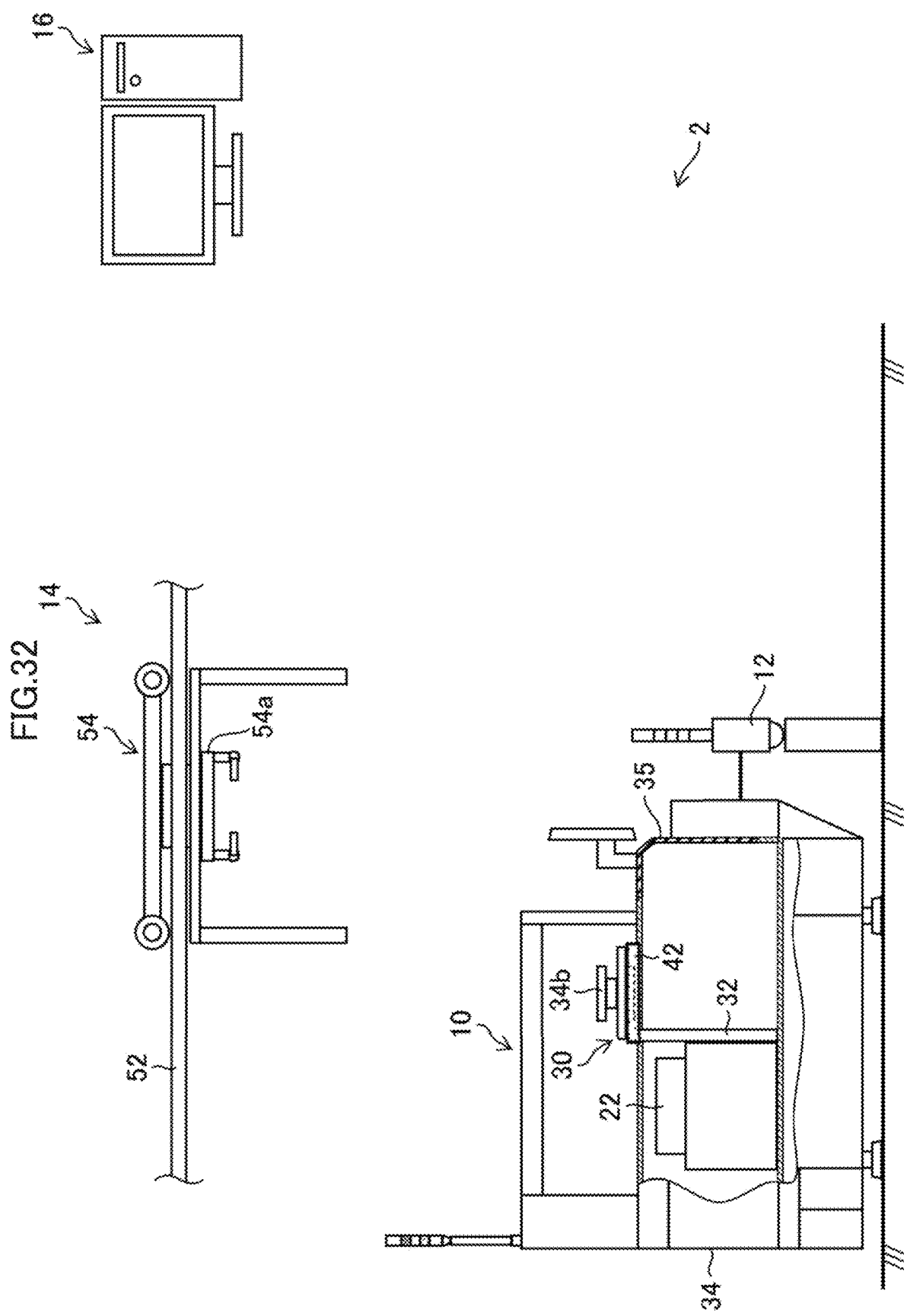

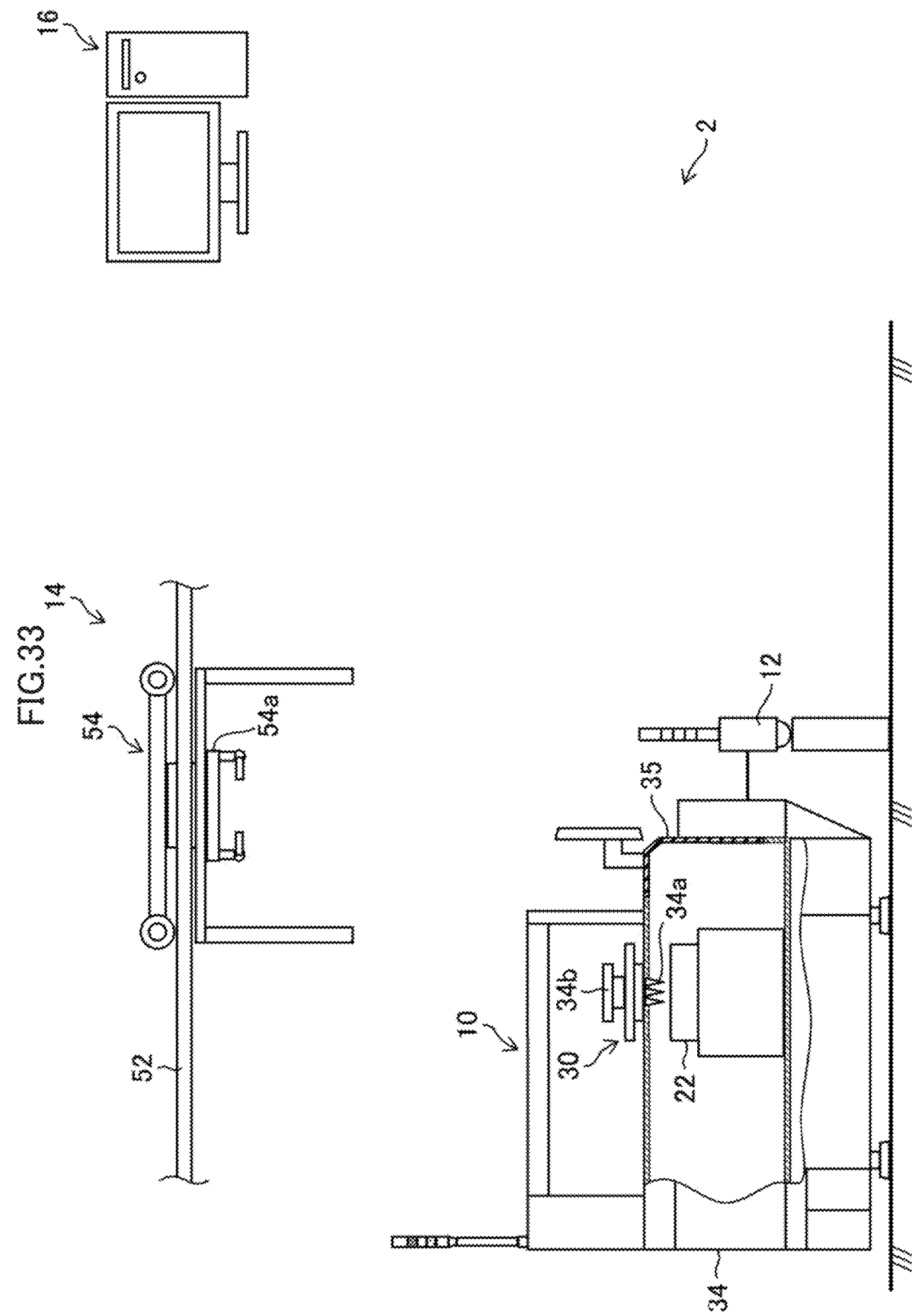

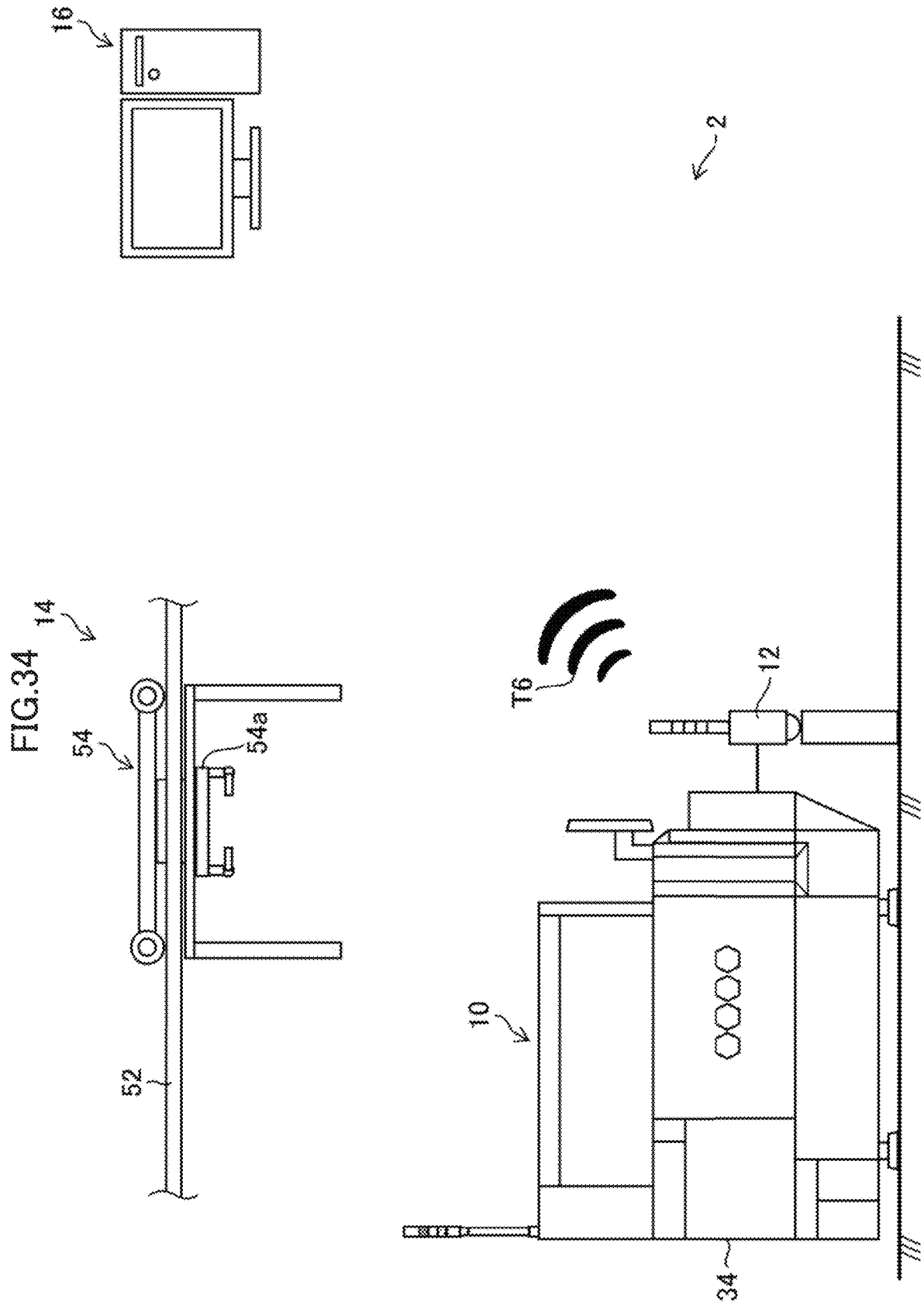

WAFER TEST SYSTEM, PROBE CARD REPLACING METHOD, AND PROBER

CROSS-REFERENCE TO RELATED APPLICATIONS

The present application is a Continuation of PCT International Application No. PCT/JP2022/045617 filed on Dec. 12, 2022 claiming priority under 35 U.S.C § 119 (a) to Japanese Patent Application No. 2022-005019 filed on Jan. 17, 2022. Each of the above applications is hereby expressly incorporated by reference, in their entirety, into the present application.

BACKGROUND OF THE INVENTION

Field of the Invention

The present invention relates to a wafer test system that inspects semiconductor wafers using a prober, a probe card replacing method for replacing the probe card of the prober, and the prober used for the wafer test system.

Description of the Related Art

On a surface of a semiconductor wafer, semiconductor chips having identical electric element circuits are formed. Electrical characteristics of each semiconductor chip are inspected by a wafer test system before semiconductor chips are individually cut by a dicer in a semiconductor manufacturing process. The wafer test system includes a prober and a tester (see Patent Literature 1).

In the prober, a probe card having probe needles is moved relatively to a wafer chuck while a semiconductor wafer is held on the wafer chuck, so as to bring each probe needle into electrical contact (contact) with an electrode pad of each semiconductor chip. The tester supplies various test signals to each semiconductor chip via a terminal connected to each probe needle, and receives and analyzes signals output from each semiconductor chip to test whether or not each semiconductor chip operates normally.

In recent years, automation of the semiconductor manufacturing process has progressed, and automation of the wafer test systems has also progressed. For example, in a wafer test system described in Patent Literature 1, a cassette housing semiconductor wafers to be inspected therein, is loaded on a load port of a prober by an overhead hoist transport (OHT). Then, the wafer test system sets a semiconductor wafer on a wafer chuck, brings each probe needle into contact with each semiconductor chip on the semiconductor wafer, and tests each semiconductor chip with a tester. The cassette housing inspected semiconductor wafers is then withdrawn from the prober by the OHT. Thus, semiconductor wafers may be inspected without involvement of an operator.

CITATION LIST

Patent Literature 1: Japanese Patent Application Laid-Open No. 2007-329458

SUMMARY OF THE INVENTION

Incidentally, the types of semiconductor chips formed on semiconductor wafers are diverse, and the types of probe cards used to inspect the semiconductor chips are also diverse. Therefore, in wafer test systems, there may be a case where the type of the probe card set in a prober need to be replaced depending on the type of semiconductor chips to be inspected. In the past, an operator always involved in the replacement of the probe card in the prober, and the replacement was performed manually or semi-automatically. For this reason, apparatuses delivered to the United States and Europe are required to meet prescribed safety standards (e.g. SEMI standard S2CE). For example, when a door of a prober is opened and closed at the time of replacement of a probe card, it is necessary to turn off a power of driving units of the prober. Furthermore, since the probe card may be accidentally dropped at the time of manual replacement of the probe card by an operator, there is a strong demand for automatic replacement of the probe card in the prober in the semiconductor manufacturing process.

In order to automate the replacement of the probe card in the prober, it is necessary to automate withdrawal of a probe card from the prober to be replaced to a new probe card and delivery of the new probe card to the prober. However, there are problems of increase in cost and installation space, when facilities for withdrawing and delivering probe cards are newly provided in the semiconductor manufacturing process.

The present invention has been made in view of such circumstances, and aims to provide a wafer test system, a method for replacing a probe card, and a prober, capable of automating replacement of probe cards at a low cost while suppressing increase of installation space.

A wafer test system for accomplishing the object of the present invention includes: a prober which includes a chuck that holds a semiconductor wafer and a probe card having probe needles thereon, and brings the probe needles in contact with semiconductor chips formed on the semiconductor wafer to inspect the semiconductor chips; an overhead hoist transport which is movable along a conveying rail while holding a cassette that houses semiconductor wafers, and configured to deliver the cassette that houses semiconductor wafers to be inspected to the prober and withdraw the cassette that houses semiconductor wafers that have been inspected from the prober; a conveying control unit configured to control the overhead hoist transport to convey the probe card between a replacement position of the probe card predetermined in the prober and a storage of the probe card located in a place different from the prober; a card conveying mechanism which is provided to the prober, and configured to convey the probe card between a holding position where the probe card is held within the prober and the replacement position; a separation control unit configured to control the card conveying mechanism to execute separation processing of conveying the probe card to be replaced from the holding position to the replacement position; and a mounting control unit configured to control the card conveying mechanism to execute mounting processing of conveying a new probe card from the replacement position to the holding position.

The wafer test system makes it possible to perform automatic replacement of the probe card of the prober using the overhead hoist transport for cassette conveyance.

In the wafer test system according to another aspect of the present invention, the prober includes a housing configured to house the chuck, the probe card, and the card conveying mechanism; an opening part formed on the housing to expose the replacement position to outside of the housing; a door switchable between an opened state where the opening part is opened and a closed state where the opening part is covered; a door operating mechanism configured to switch the door between the opened state and the closed state; and a door operation control unit configured to drive the door operating mechanism to switch the door from the closed state to the opened state in the separation processing, and drive the door operating mechanism to switch the door from the opened state to the closed state in the mounting processing.

The wafer test system according to another aspect of the present invention includes a human detection sensor configured to detect presence or absence of a person intruding into a protected area that is preset based on a position of the door, wherein the door operation control unit stops driving of the door operating mechanism while a person is intruding into the protected area based on a detection result by the human detection sensor. This prevents the door from colliding with a person or prevents the hands or the fingers of the person from being pinched by the door.

In the wafer test system according to another aspect of the present invention, in a case where driving of the door operating mechanism is stopped halfway, the door operation control unit restarts driving of the door operating mechanism in response to change of the detection result by the human detection sensor from the presence to the absence of a person intruding into the protected area. This can reduce the time and efforts of the operator who performs restart operation.

The wafer test system according to another aspect of the present invention includes a card holding unit configured to detachably hold the probe card at the holding position, in which: the card conveying mechanism includes a tray capable of holding the probe card, and is configured to convey the tray between the holding position and the replacement position; the separation control unit sequentially executes, as the separation processing, processing of driving the card conveying mechanism to convey the tray to the holding position, processing of releasing holding of the probe card by the card holding unit to cause the tray to hold the probe card, and processing of driving the card conveying mechanism to convey the tray from the holding position to the replacement position; and in a case where the new probe card is held on the tray at the replacement position, the mounting control unit sequentially executes, as the mounting processing, processing of driving the card conveying mechanism to convey the tray from the replacement position to the holding position, and processing of causing the card holding unit to hold the probe card. As a result, the separation processing and the mounting processing can also be automated, so that the entire replacement of the probe card of the prober can be performed automatically.

In the wafer test system according to another aspect of the present invention, the prober includes a card holder that holds the probe card, and the card conveying mechanism integrally conveys the probe card and the card holder between the holding position and the replacement position.

In the wafer test system according to another aspect of the present invention, the card holder includes a card holding hole that holds the probe card; the overhead hoist transport loads the probe card in the card holding hole of the card holder at the replacement position; the wafer test system comprises a plurality of positioning parts provided at an opening edge part which forms the card holding hole of the card holder; and each of the plurality of positioning parts has a guide surface configured to guide the probe card to the card holding hole in a case where the overhead hoist transport loads the probe card in the card holding hole.

In the wafer test system according to another aspect of the present invention, the conveying control unit controls the overhead hoist transport to execute withdrawal processing of conveying the probe card to be replaced of the prober from the replacement position to the storage, and delivery processing of conveying the new probe card from the storage to the replacement position; the wafer test system comprises a human detection sensor configured to detect presence or absence of a person intruding into a protected area that is preset based on the replacement position; the conveying control unit stops the withdrawal processing during a state of the presence of a person intruding into the protected area, based on a detection result by the human detection sensor; and the conveying control unit stops the delivery processing during the state of the presence of the person intruding into the protected area, based on the detection result by the human detection sensor. This prevents the overhead hoist transport from colliding with the person.

In the wafer test system according to another aspect of the present invention, the conveying control unit controls the overhead hoist transport to execute withdrawal processing of conveying the probe card to be replaced of the prober from the replacement position to the storage, and delivery processing of conveying the new probe card from the storage to the replacement position; the overhead hoist transport includes a lift holding un it configured to be vertically movable and detachably hold the cassette or the probe card; the conveying control unit executes, as the withdrawal processing, processing of moving the overhead hoist transport to a position directly above the replacement position, processing of lowering the lift holding unit to the replacement position, processing of causing the lift holding unit to hold the probe card at the replacement position, processing of lifting the lift holding unit, and processing of moving the overhead hoist transport from the position directly above the replacement position to the storage; and the conveying control unit executes, as the delivery processing, processing of causing the lift holding unit to hold the probe card in the storage, processing of moving the overhead hoist transport from the storage to the position directly above the replacement position, processing of lowering the lift holding unit, processing of causing the lift holding unit to release holding of the probe card at the replacement position, and processing of lifting the lift holding unit. This makes it possible to perform automatic replacement of the probe card of the prober using the overhead hoist transport for cassette conveyance.

The wafer test system according to another aspect of the present invention includes a card conveying mechanism provided in the prober and configured to convey the probe card between the holding position where the probe card is held within the prober and the replacement position, wherein: the card conveying mechanism includes a tray capable of holding the probe card, and configured to convey the tray between the holding position and the replacement position; the wafer test system comprises a card sensor provided in the tray and configured to detect presence or absence of the probe card on the tray; and the conveying control unit executes processing of lowering the lift holding unit while the card sensor detects the absence of the probe card on the tray, and further executes processing of releasing holding of the probe card by the lift holding unit and lifting the lift holding unit in response to a detection result by the card sensor switching from the absence to the presence of the probe card on the tray. This makes it possible to automate the delivery processing.

In the wafer test system according to another aspect of the present invention, the conveying rail extends in an X direction out of XYZ directions perpendicular to each other; the overhead hoist transport includes a lift holding unit which is vertically movable in the Z direction and whose position is adjustable within a predetermined movable range in the Y direction, the lift holding unit configured to be capable of detachably holding the cassette or the probe card; the prober includes a load port which is provided at a position different from the replacement position in the X direction and configured to be loaded with the cassette by the overhead hoist transport; and within the movable range of the lift holding unit in the Y direction, the lift holding unit is capable of loading the cassette on the load port and capable of loading the probe card at the replacement position. This makes it possible to withdraw the probe card from the replacement position and to deliver the probe card to the replacement position using the overhead hoist transport for cassette conveyance.

A probe card replacing method for accomplishing the object of the present invention is a method for replacing a probe card for a prober which includes a chuck that holds a semiconductor wafer and a probe card having probe needles thereon, and brings the probe needles in contact with semiconductor chips formed on the semiconductor wafer to inspect the semiconductor chips, the probe card replacing method including: a separation step in which a card conveying mechanism of the prober executes separation processing of conveying the probe card to be replaced from a holding position where the probe card is held inside the prober to a replacement position of the probe card that is predetermined in the prober; a withdrawal step in which an overhead hoist transport executes withdrawal processing of conveying the probe card to be replaced that has been conveyed to the replacement position, from the replacement position to a storage of the probe card located in a place different from the prober, wherein the overhead hoist transport is configured to move along a conveying rail while holding a cassette that houses semiconductor wafers and configured to deliver the cassette that houses semiconductor wafers to be inspected to the prober and withdraw the cassette that houses semiconductor wafers that have been inspected, from the prober; a delivery step in which the overhead hoist transport executes delivery processing of conveying a new probe card from the storage to the replacement position; and a mounting step in which the card conveying mechanism executes mounting processing of conveying the new probe card from the replacement position to the holding position.

A prober for accomplishing the object of the present invention is a prober which includes a chuck that holds a semiconductor wafer and a probe card having probe needles thereon, and brings the probe needles in contact with semiconductor chips formed on the semiconductor wafer to inspect the semiconductor chips, the prober including: a card conveying mechanism configured to convey the probe card between a holding position in the prober and a replacement position where the probe card is replaced; and a load port configured to be loaded with a cassette that houses semiconductor wafers by an overhead hoist transport that is movable along a conveying rail extending in an X direction out of XYZ directions perpendicular to each other and includes a lift holding unit which is vertically movable in the Z direction and whose position is adjustable within a predetermined movable range in the Y direction, wherein: within the movable range of the lift holding unit in the Y direction, the lift holding unit is capable of loading the cassette on the load port and capable of loading the probe card at the replacement position; the probe card includes a hold part that is held by the lift holding unit; and the replacement position is a position where the probe card is replaceable by the overhead hoist transport.

The present invention may automate the replacement of a probe card at a low cost while suppressing an increase in installation space.

BRIEF DESCRIPTION OF THE DRAWINGS

FIG. 18 is an explanatory view for illustrating separation processing (replacement instruction) in step S1 shown in FIG. 17.
FIG. 19 is an explanatory view for illustrating the separation processing (tray conveyance) in step S1 shown in FIG. 17.
FIG. 20 is an explanatory view for illustrating the separation processing (start of switching to a door opened state) in step S1 shown in FIG. 17.
FIG. 21 is an explanatory view for illustrating the separation processing (emergency stop of a door operating mechanism) in step S1 shown in FIG. 17.
FIG. 22 is an explanatory view for illustrating the separation processing (restart of driving of the door operating mechanism) in step S1 shown in FIG. 17.
FIG. 23 is an explanatory view for illustrating the separation processing (notification of completion of replacement preparation) in step S1 shown in FIG. 17.
FIG. 24 is an explanatory view for illustrating the withdrawal processing (lowering of a lift holding unit) in step S2 shown in FIG. 17.
FIG. 25 is an explanatory view for illustrating the withdrawal processing (lifting of the lift holding unit) in step S2 shown in FIG. 17.
FIG. 26 is an explanatory view for illustrating delivery processing (conveying the probe card) in step S3 shown in FIG. 17.
FIG. 27 is an explanatory view for illustrating the delivery processing (lowering of the lift holding unit) in step S3 shown in FIG. 17.

FIG. 28 is an explanatory view for illustrating the delivery processing (lifting of the lift holding unit) in step S3 shown in FIG. 17.

FIG. 29 is an explanatory view for illustrating mounting processing (mounting instruction) in step S4 shown in FIG. 17.

FIG. 30 is an explanatory view for illustrating the mounting processing (start of switching to a door closed state) in step S4 shown in FIG. 17.

FIG. 31 is an explanatory view for illustrating the mounting processing (read information, authentication result) in step S4 shown in FIG. 17.

FIG. 32 is an explanatory view for illustrating the mounting processing (mounting of the probe card) in step S4 shown in FIG. 17.

FIG. 33 is an explanatory view for illustrating the mounting processing (moving a chuck) in step S4 shown in FIG. 17.

FIG. 34 is an explanatory view for illustrating the mounting processing (notification of completion of replacement) in step S4 shown in FIG. 17.

DESCRIPTION OF THE EMBODIMENTS

Overall Configuration of Wafer Test System

Figure 1:
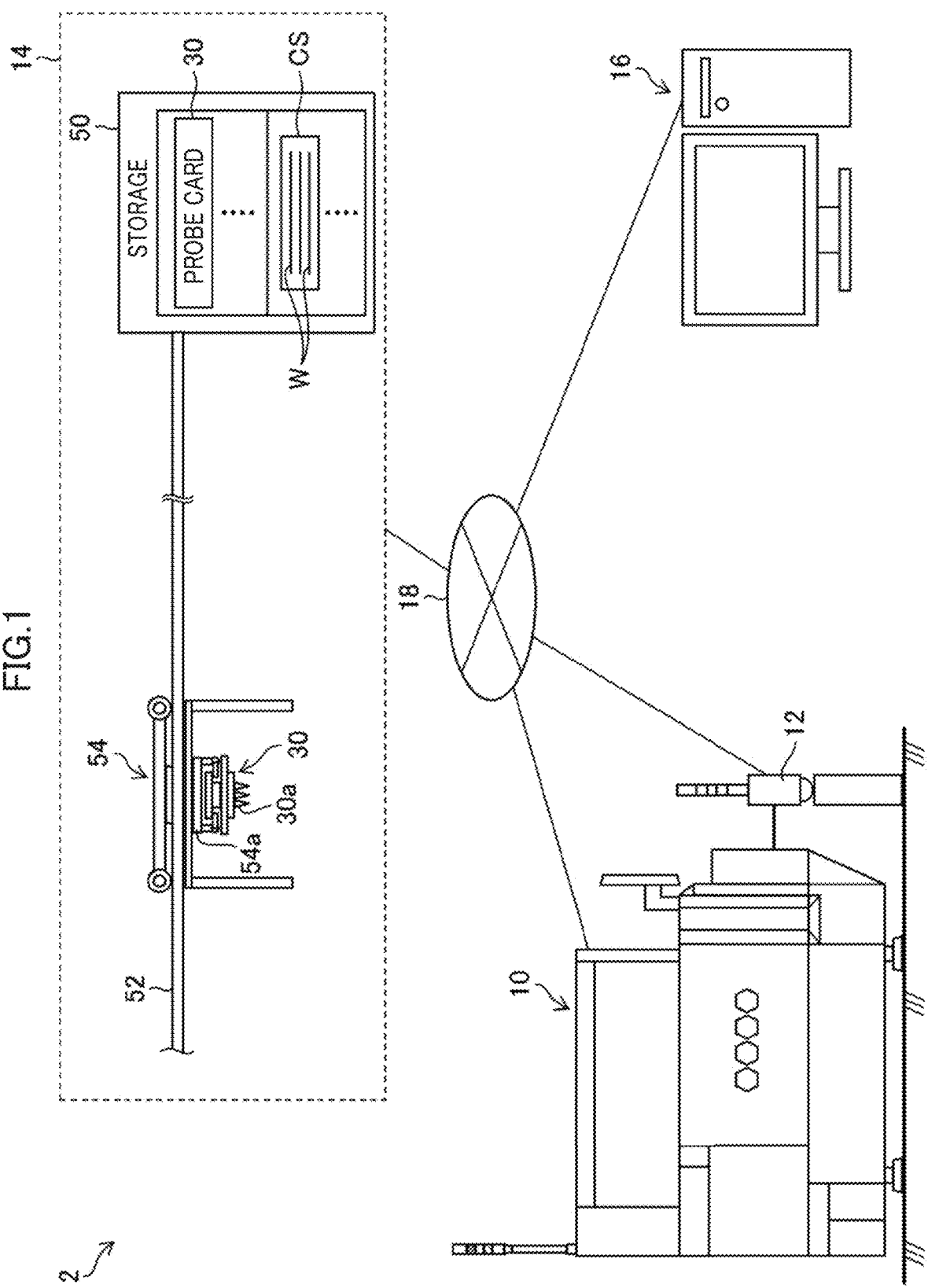
FIG. 1 is a schematic diagram of a wafer test system.

FIG. 1 is a schematic diagram of a wafer test system 2. As shown in FIG. 1, the wafer test system 2 automatically inspects the electrical characteristics of each semiconductor chip (illustration omitted) of a semiconductor wafer W using a prober 10 described later. The wafer test system 2 also automatically performs replacement of a probe card 30 of the prober 10.

Roughly, the wafer test system 2 includes the prober 10, a tester 11 (see FIG. 2), a laser scanner 12, a wafer conveying mechanism 14, and a generic model for communications and control of manufacturing equipment (GEM) host 16 that is a GEM computer. Note that the wafer test system 2 includes two or more probers 10 (see FIG. 14).

Each of the probers 10, the wafer conveying mechanism 14, and the GEM host 16 are connected to each other through a known network (networks) 18. Note that, in actuality, the network 18 that connects each of the probers 10 and the GEM host 16 is different from the network 18 that connects the wafer conveying mechanism 14 and the GEM host 16 (sec FIG. 16). Each of the probers 10 and the wafer conveying mechanism 14 (OHT 54) are connected through an I/O interface 19 (in conformity with SEMI-E48) (SEMI: Semiconductor Equipment and Materials International) (see FIG. 16). The laser scanner 12, which is connected to the probers 10, is connected to the GEM host 16 through the probers 10 and the network 18.

Prober

Figure 2:
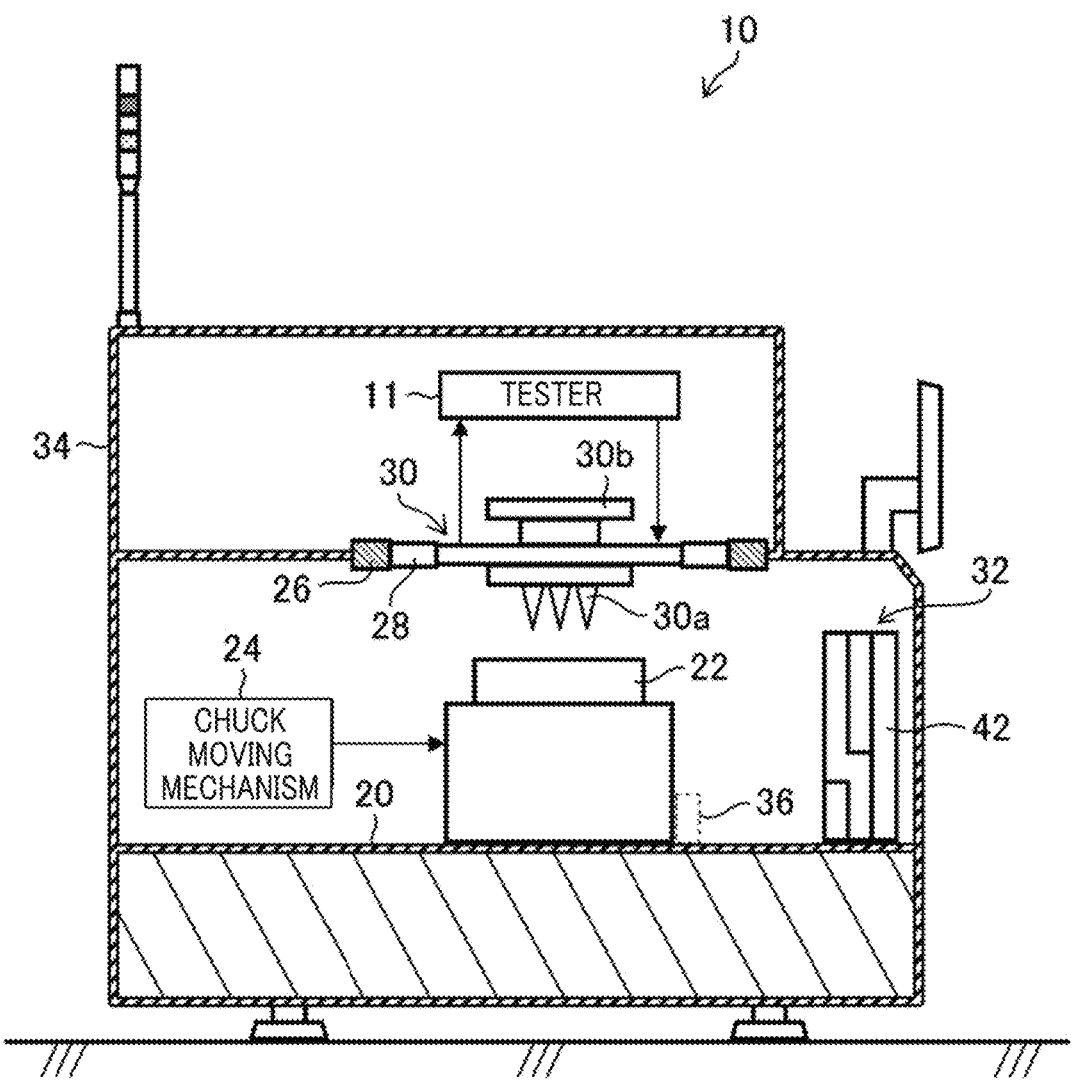
FIG. 2 is a schematic diagram of a prober and a tester.

FIG. 2 is a schematic diagram of the prober 10 and the tester 11. Note that among the XYZ directions perpendicular to each other in the drawing, the XY directions are horizontal directions, and the Z direction is an up-down direction. As shown in FIG. 2, roughly, the prober 10 includes a base 20, a load port 21 (see FIG. 13), a chuck 22, a chuck moving mechanism 24, a card holding unit 26, a card holder 28, the probe card 30, a card conveying mechanism 32, and a housing 34 that houses these. Here, since the detailed configuration of the probers 10 is a publicly known technology (see, for example, Japanese Patent Application Laid-Open No. 2018-117096), only a part of the configuration of the probers 10 is described here.

On the base 20, the chuck 22 is held movably in each direction of the XYZ directions and is held rotatably in a θ direction that is a rotational direction around an axis parallel to the Z direction. On the base 20, the card conveying mechanism 32 is also held movably in the Y direction.

The load port 21 (see FIG. 13) is loaded with a cassette CS that houses semiconductor wafers W to be inspected by the OHT 54 of the wafer conveying mechanism 14 described later. Here, although illustration is omitted, the prober 10 includes a conveying mechanism that conveys semiconductor wafers W between the load port 21 and the chuck 22.

On the upper surface of the chuck 22, the semiconductor wafer W is held by various holding methods such as vacuum suction. Inside the chuck 22, a temperature regulation unit (illustration omitted) is provided for regulating the temperature of the semiconductor wafer W.

In addition, the chuck 22 includes a coupling part 36 at a position facing the card conveying mechanism 32 described later. The coupling part 36 is used to couple the chuck 22 and the card conveying mechanism 32. The coupling part 36 is housed in the chuck 22 except in replacement of the probe card 30 described later. The coupling part 36 protrudes from a side surface of the chuck 22 in the Y direction and is coupled to the card conveying mechanism 32 when replacing the probe card 30. Accordingly, when replacing the probe card 30, the chuck 22 and the card conveying mechanism 32 is movable integrally. Note that, the chuck 22 and the card conveying mechanism 32 may be made to be integrally movable on the constant basis, without installation of the coupling part 36.

The chuck moving mechanism 24 is a known actuator including a motor or the like. The chuck moving mechanism 24 may move the chuck 22 in the XYZ and θ directions. As a result, the semiconductor wafer W held on the chuck 22 and probe needles 30a described later may be moved relatively to the XYZ and θ directions. Further, the chuck moving mechanism 24 moves the chuck 22 and the card conveying mechanism 32 integrally in the Y direction when replacing the probe card 30. Note that a mechanism for moving the card conveying mechanism 32 may be provided separately from the chuck moving mechanism 24.

The card holding unit 26 (also referred to as a head stage) is provided above the chuck 22 in the Z direction and detachably holds the card holder 28. The card holder 28 holds an outer circumference of the probe card 30. Accordingly, the card holding unit 26 detachably holds the probe card 30 through the card holder 28.

Figure 3:
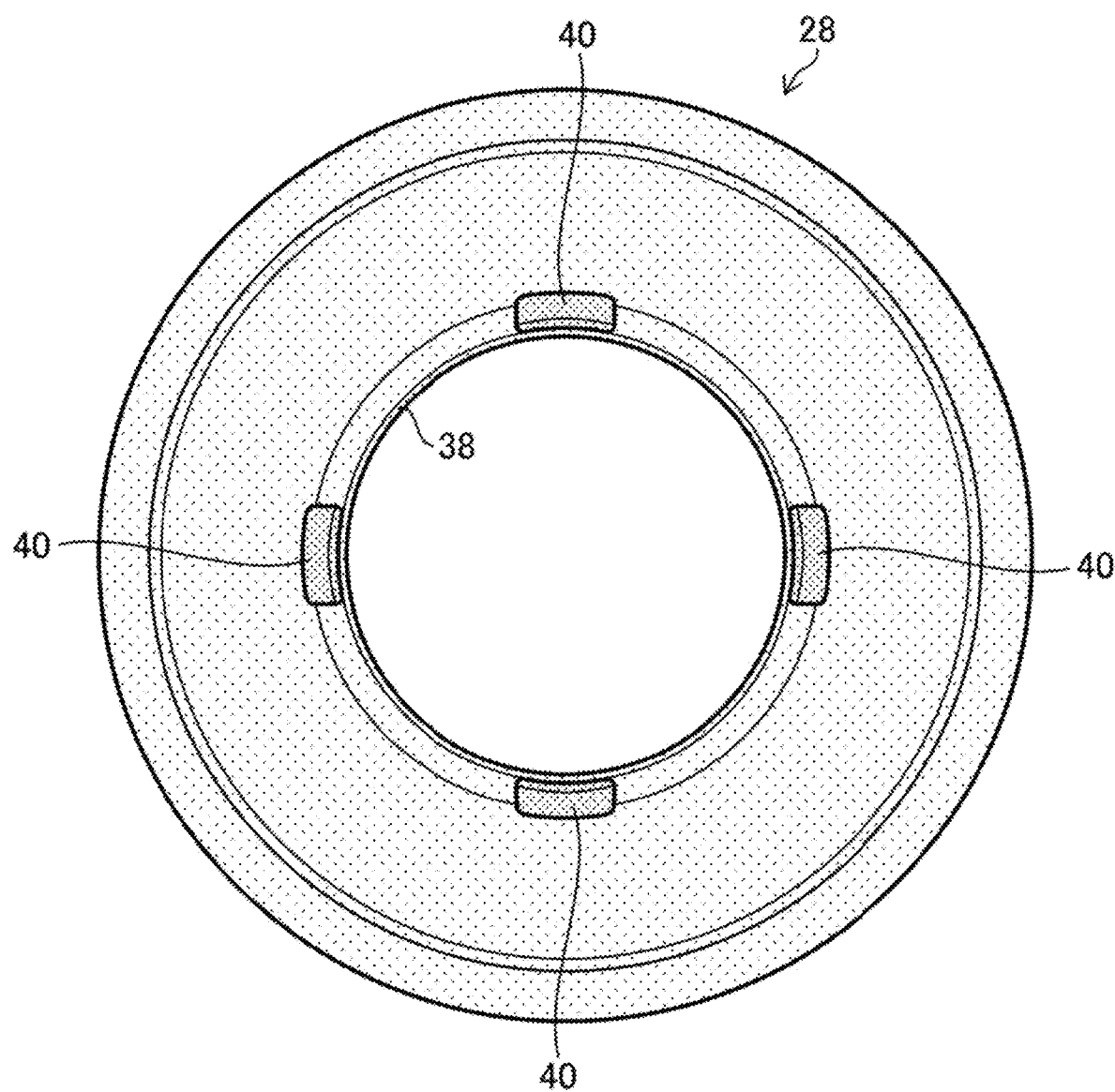
FIG. 3 is a top view of a card holder.
Figure 4:
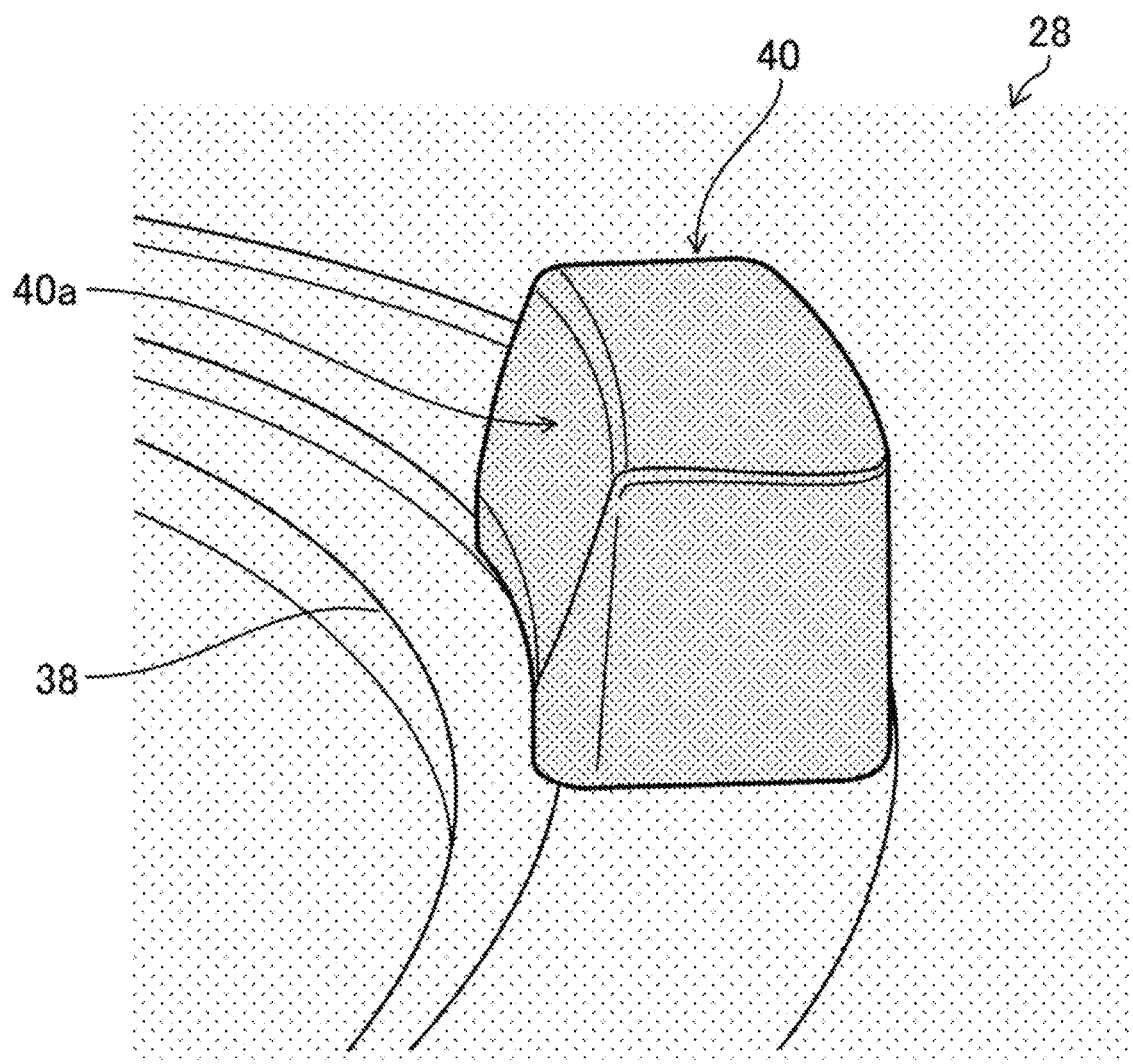
FIG. 4 is an enlarged view of positioning parts provided on a card holder.

FIG. 3 is a top view of the card holder 28. FIG. 4 is an enlarged view of positioning parts 40 provided on the card holder 28.

As shown in FIGS. 3 and 4, the card holder 28 includes a card holding hole 38 where an outer circumferential part of the probe card 30 is held. The card holder 28 also includes the positioning parts 40 provided at an interval, along an opening edge part which forms the card holding hole 38.

In the case of loading the probe card 30 in the card holding hole 38 by the OHT 54 described later (see FIG. 27), the positioning parts 40 each have a guide surface 40a that guides the probe card 30 to the card holding hole 38. The guide surface 40a is an inclined surface, and a lower end part of the guide surface 40 in the Z direction is located on the opening edge part of the card holding hole 38. The inclined surface (the guide surface 40a) is inclined so as to be gradually away from the card holding hole 38 in a horizontal direction toward an upper side in the Z direction. This makes it possible to guide the probe card 30 to the card holding hole 38 along the guide surface 40a of each of the positioning parts 40.

Back to FIG. 2, the probe card 30 has the probe needles 30a arranged in accordance with the arrangement of electrode pads of a large number of unillustrated semiconductor chips formed on the semiconductor wafer W or the like. On the upper surface of the probe card 30, a hold part (to-be-held part) 30b is provided. The hold part 30b is held by a lift holding unit 54a (see FIG. 1) of the OHT 54 provided to the wafer conveying mechanism 14 described later. The probe card 30 is further provided with unillustrated connection terminals that are electrically connected to the probe needles 30a, and the tester 11 is connected to the connection terminals.

The tester 11 supplies various test signals to the electrode pads of the respective semiconductor chips of the semiconductor wafer W through the connection terminals and the probe needles 30a of the probe card 30, and receives and analyzes signals output from the electrode pads to inspect (test) whether or not each of the semiconductor chips operate normally. Here, since the configuration of the tester 11 and a test method thereof are known technologies, detailed description thereof is omitted.

The probe card 30 used for such inspection of the semiconductor chips is replaced, for example, depending on the type of the semiconductor chips or replaced for every prescribed number of times of inspection. In the wafer test system 2 according to the present embodiment, the aforementioned chuck moving mechanism 24, the card conveying mechanism 32 described later, and the wafer conveying mechanism 14 described later are used to automatically replace the probe card 30. Here, "replacement of the probe card 30" includes a case where a new probe card 30 is mounted on the prober 10 in a state where no probe card 30 is mounted on the prober 10. However, as an example, the present embodiment describes about a case where the probe card (prove card to be replaced) 30 which is already held by the card holding unit 26 to be replaced, is replaced with a new probe card 30.

In a case where the probe card 30 is replaced, the card conveying mechanism 32, together with the chuck moving mechanism 24, performs: separation processing of integrally conveying the card holder 28 and the prove card 30 to be replaced from a "holding position" to a "replacement position"; and mounting processing of integrally conveying the card holder 28 and the new probe card 30 from the "replacement position" to the "holding position". Here, the holding position is a position where the card holding unit 26 holds the probe card 30 and the card holder 28. The replacement position is a position where the replacement of the probe card 30 is performed in the prober 10, and more specifically, the position where the OHT 54 described later (see FIG. 1) may withdraw and deliver the probe card 30 (see FIG. 8).

In a case where the card conveying mechanism 32 is coupled to the chuck 22 via the coupling part 36 when replacing the probe card 30 (see FIG. 7), the card conveying mechanism 32 integrally conveys the card holder 28 and the probe card 30 between the holding position and the replacement position.

Figure 7:
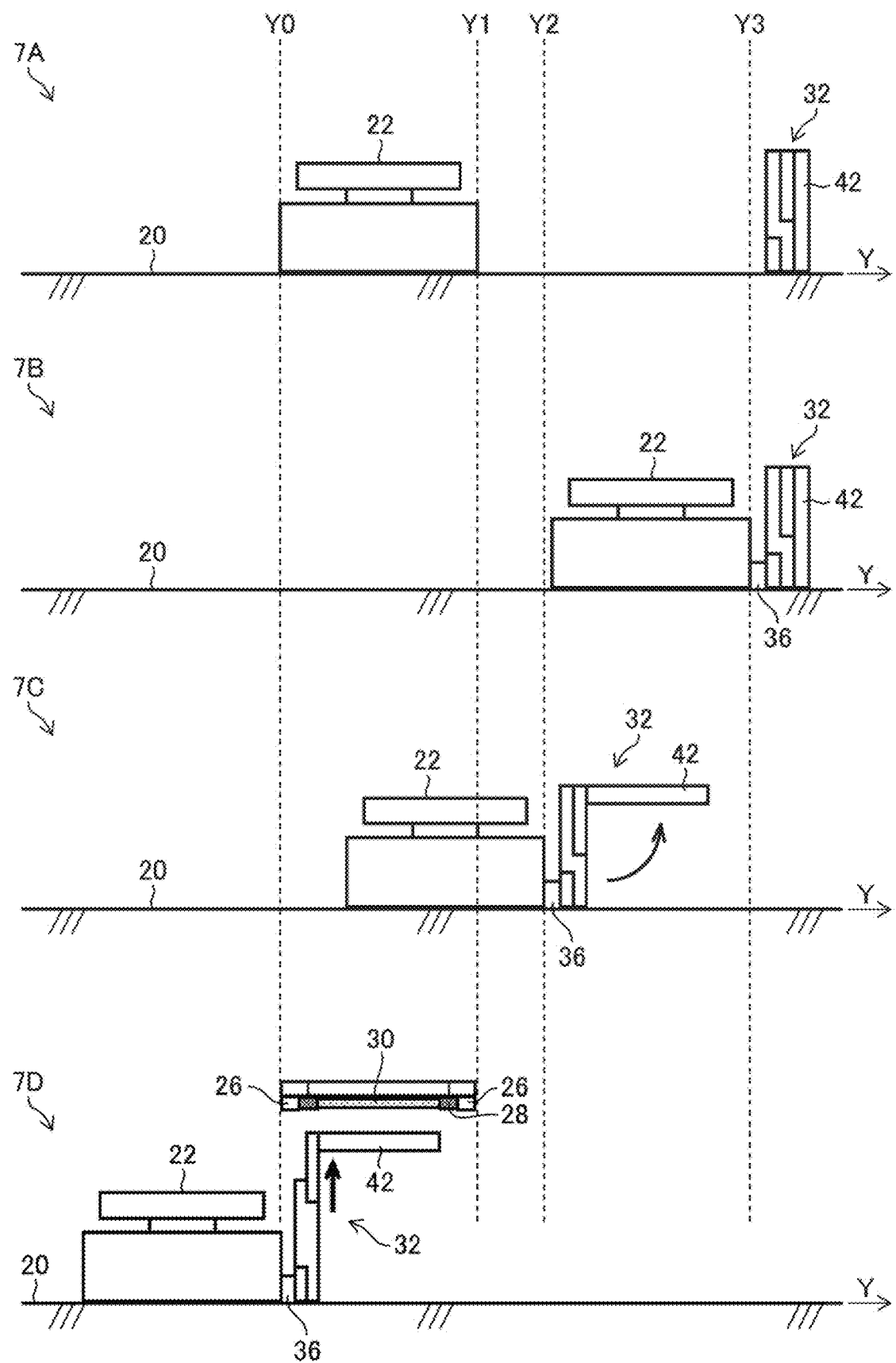
FIG. 7 is an explanatory view for illustrating separation processing when replacing the probe card.

The card conveying mechanism 32 holds a substantially planar tray 42, which may hold (may support) the probe card 30 and the card holder 28, in such a manner that the tray 42 may be displaced between a laid state parallel to an XZ plane (see FIG. 2) and an upright state parallel to an XY plane (see FIG. 7). Further, the card conveying mechanism 32 holds the tray 42 in the upright state in such a manner that the tray 42 may be vertically movable in the Z direction (see FIG. 7).

Figure 5:
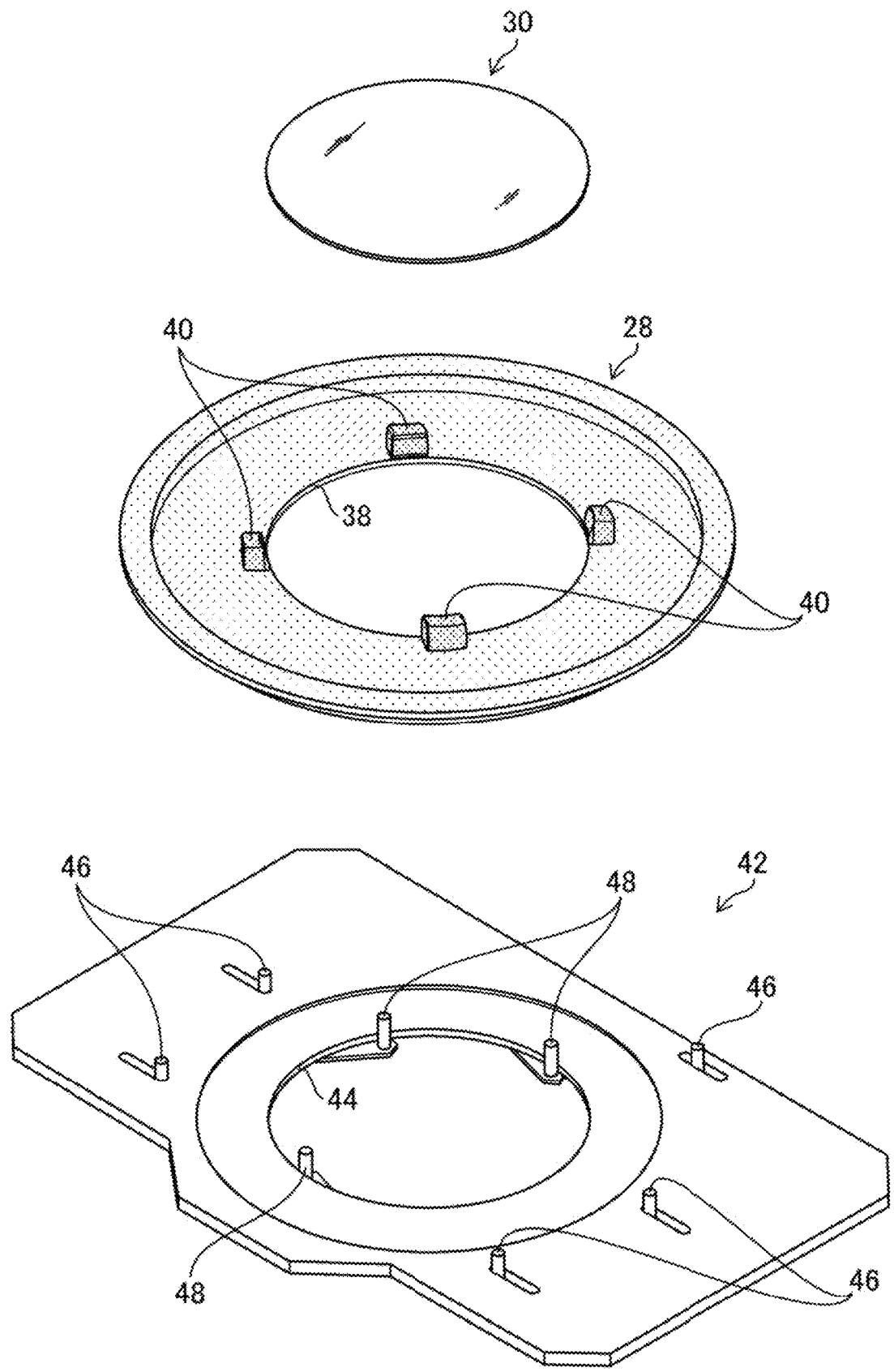
FIG. 5 is a perspective view of a tray that holds the probe card and the card holder.
Figure 6:
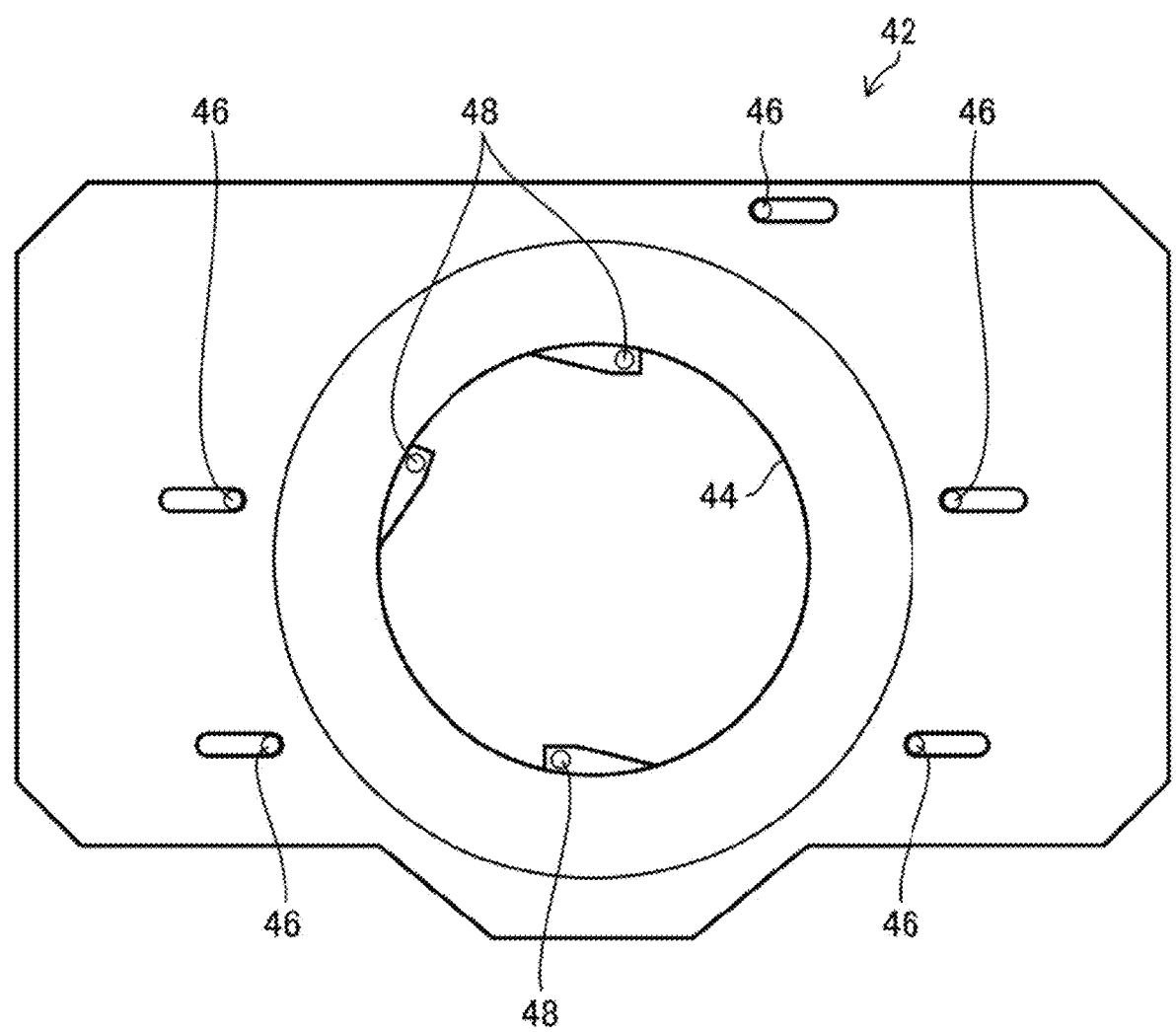
FIG. 6 is a top view of the tray.

FIG. 5 is a perspective view of the tray 42 that holds (supports) the probe card 30 and the card holder 28. FIG. 6 is a top view of the tray 42. As shown in FIGS. 5 and 6, the tray 42 has a holder holding hole 44 that holds an outer circumferential part of the card holder 28, and holds the card holder 28 with the holder holding hole 44 in the upright state. This allows the tray 42 to integrally hold the probe card 30 and the card holder 28.

The tray 42 is equipped with holder sensors 46 that detect presence or absence of the card holder 28, and card sensors 48 that detect presence or absence of the probe card 30. Each of the holder sensors 46 is, for example, a pressing type (or pressure sensitive type) sensor provided on the bottom surface of the holder holding hole 44. In a case where the card holder 28 is held in the holder holding hole 44, each of the holder sensors 46 is pressed by the card holder 28 and changes its sensor output value. This makes it possible to detect the presence or absence of the card holder 28 on the tray 42 based on the sensor output value of each of the holder sensors 46.

Each of the card sensors 48 is, for example, a pressing type sensor provided inside the holder holding hole 44. The card sensors 48 respectively have sensor heads. Each of the sensor heads protrudes upward in the Z direction from the inside of the card holding hole 38 in a case where the card holder 28 is held in the holder holding hole 44. Accordingly, in a case the probe card 30 is held in the card holding hole 38, each of the card sensors 48 is pressed by the card holder 28 and changes its sensor output value. This makes it possible to detect the presence or absence of the probe card 30 on the tray 42 based on the sensor output value of each of the card sensors 48.

Figure 8:
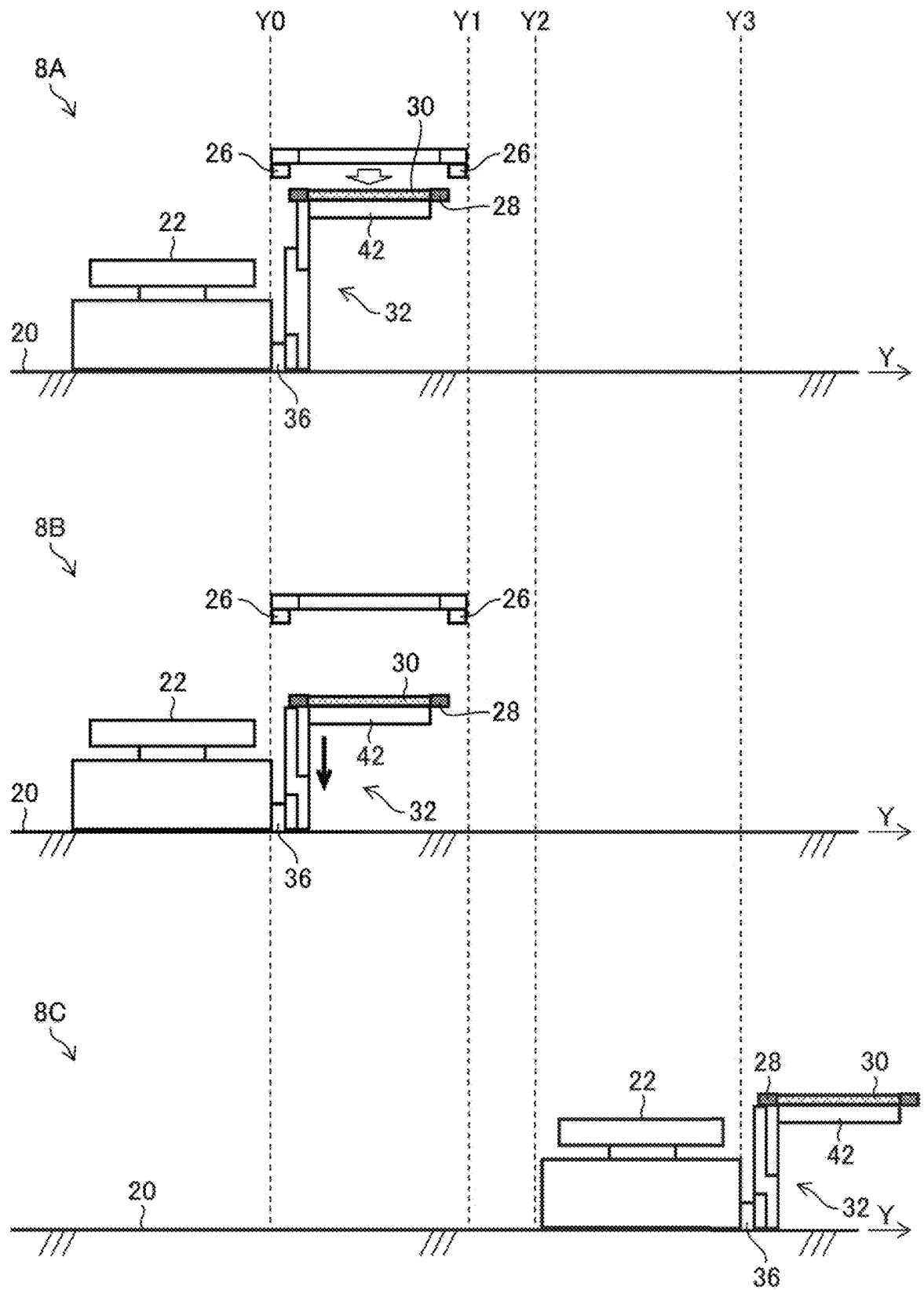
FIG. 8 is an explanatory view for illustrating the separation processing when replacing the probe card.

FIGS. 7 and 8 are explanatory views for illustrating the separation processing at the time of replacing the probe card 30. Note that in FIGS. 7 and 8 (FIGS. 9 and 10 described later), the internal structure of the prober 10 and the probe card 30 or the like are simply described in order to prevent complicated drawings, and in addition, the size of the probe card 30 and the card holder 28 is emphasized more than the size of the tray 42 so as to clarify that the probe card 30 and the card holder 28 are conveyed on the tray 42.

As shown by reference numeral 7A in FIG. 7, before the start of separation processing, the chuck 22 is positioned at an inspection position Y1 that is a position vertically below the card holding unit 26. In addition, the card conveying mechanism 32 is positioned at the replacement position. Moreover, the tray 42 of the card conveying mechanism 32 is switched to the laid state.

As shown by reference numeral 7B in FIG. 7, When the separation processing is started, the chuck moving mechanism 24 moves the chuck 22 to a coupling position Y3. The coupling position Y3 is a position adjacent to the replacement position. At the coupling position Y3, the chuck 22 may be coupled to the card conveying mechanism 32. Then, the coupling part 36 protrudes in the Y direction from the side surface of the chuck 22 and is coupled to the card conveying mechanism 32. Accordingly, the chuck 22 and the card conveying mechanism 32 become integrally movable in the Y direction.

As shown by reference numeral 7C in FIG. 7, After coupling of the chuck 22 and the card conveying mechanism 32, the chuck moving mechanism 24 moves the chuck 22 to a tray switching position Y2 between the inspection position Y1 and the coupling position Y3. After this movement is completed, the card conveying mechanism 32 switches the tray 42 from the laid state to the upright state.

As shown by reference numeral 7D in FIG. 7, after the tray 42 is switched to the upright state, the chuck moving mechanism 24 moves the chuck 22 to a separation/mounting position Y0. The separation/mounting position Y0 is a position where the position of the tray 42 is adjusted to a position vertically below the card holding unit 26. More specifically, the separation/mounting position Y0 is the position where the holder holding hole 44 of the tray 42 matches the card holder 28 held on the card holding unit 26. After this movement is completed, the card conveying mechanism 32 lifts the tray 42 and conveys the tray 42 to a position where the tray 42 is brought into contact with the card holder 28 held by the card holding unit 26. As a result, the card holder 28 is held inside the holder holding hole 44 of the tray 42. The probe card 30 is held through the card holder 28.

As shown by reference numeral 8A in FIG. 8, in a case where the tray 42 holds the probe card 30 and the card holder 28, and the holding of the card holder 28 by the card holding unit 26 is released, the sensor output values of the respective holder sensors 46 and the output values of the respective card sensors 48 change. Thus, the probe card 30 and the card holder 28 are put in a state of being held on the tray 42.

As shown by reference numeral 8B in FIG. 8, in a case where the holding of the card holder 28 by the card holding unit 26 is released, the card conveying mechanism 32 lowers the tray 42.

As shown by reference numeral 8C in FIG. 8, in a case where the lowering of the tray 42 is completed, the chuck moving mechanism 24 moves the chuck 22 to the coupling position Y3. Accordingly, the tray 42 of the card conveying mechanism 32 is conveyed to the replacement position, and so the probe card 30 and the card holder 28 are also conveyed to the replacement position. Note that a door 35 is provided in front of the replacement position, which will be described later in detail. When the chuck moving mechanism 24 conveys the tray 42 toward the replacement position, the chuck moving mechanism 24 temporarily stops conveyance of the tray 42 in front of the door 35, and restarts conveyance of the tray 42 after the door 35 is opened (see FIG. 22 described later). When the tray 42 is conveyed to the replacement position, it becomes possible to perform withdrawal of the probe card 30 to be replaced from the tray 42 by the OHT 54 described later (see FIG. 25) and delivery of the new probe card 30 to the tray 42 by the OHT 54 (see FIG. 27).

Figure 9:
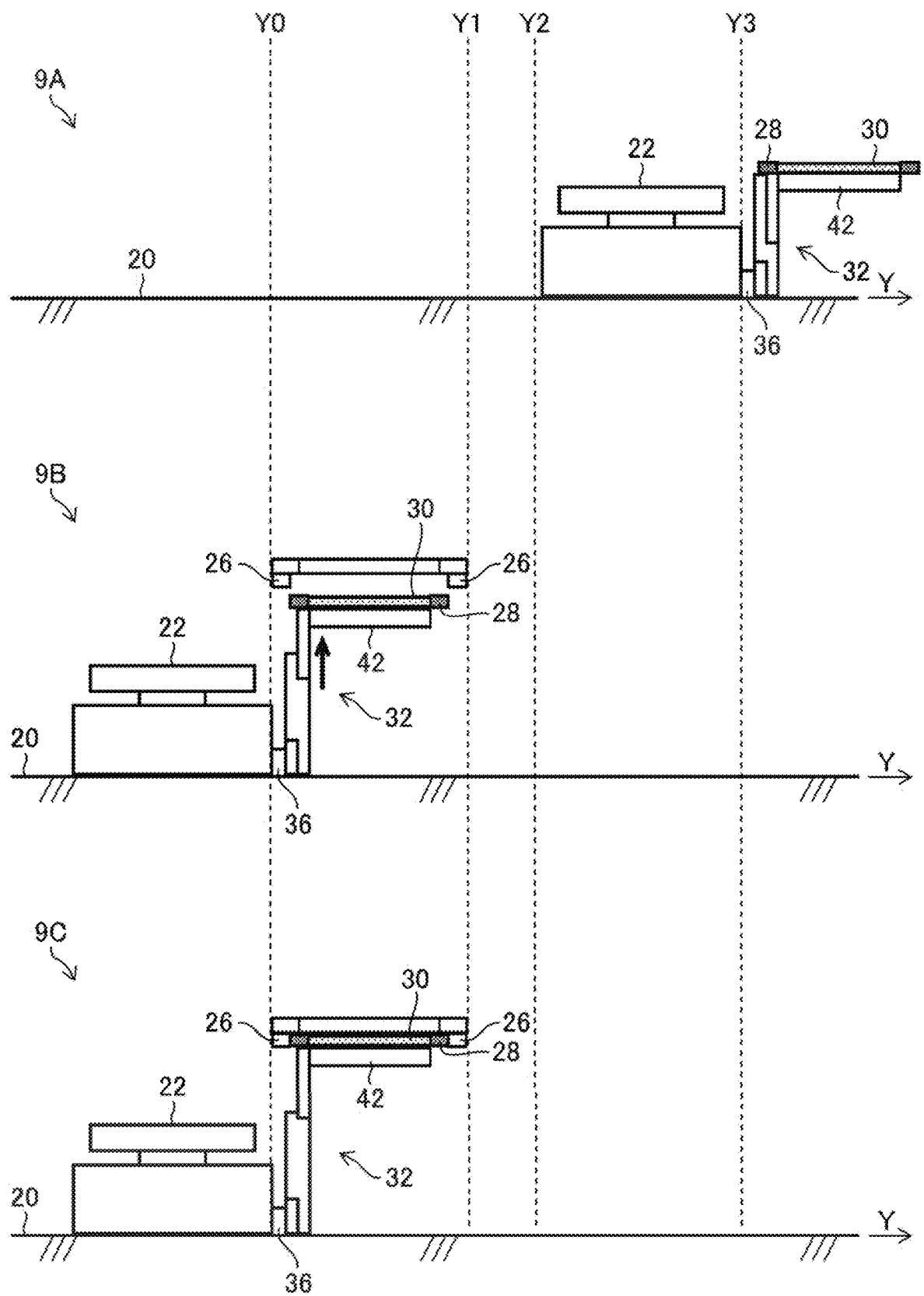
FIG. 9 is an explanatory view for illustrating mounting processing when replacing the probe card.
Figure 10:
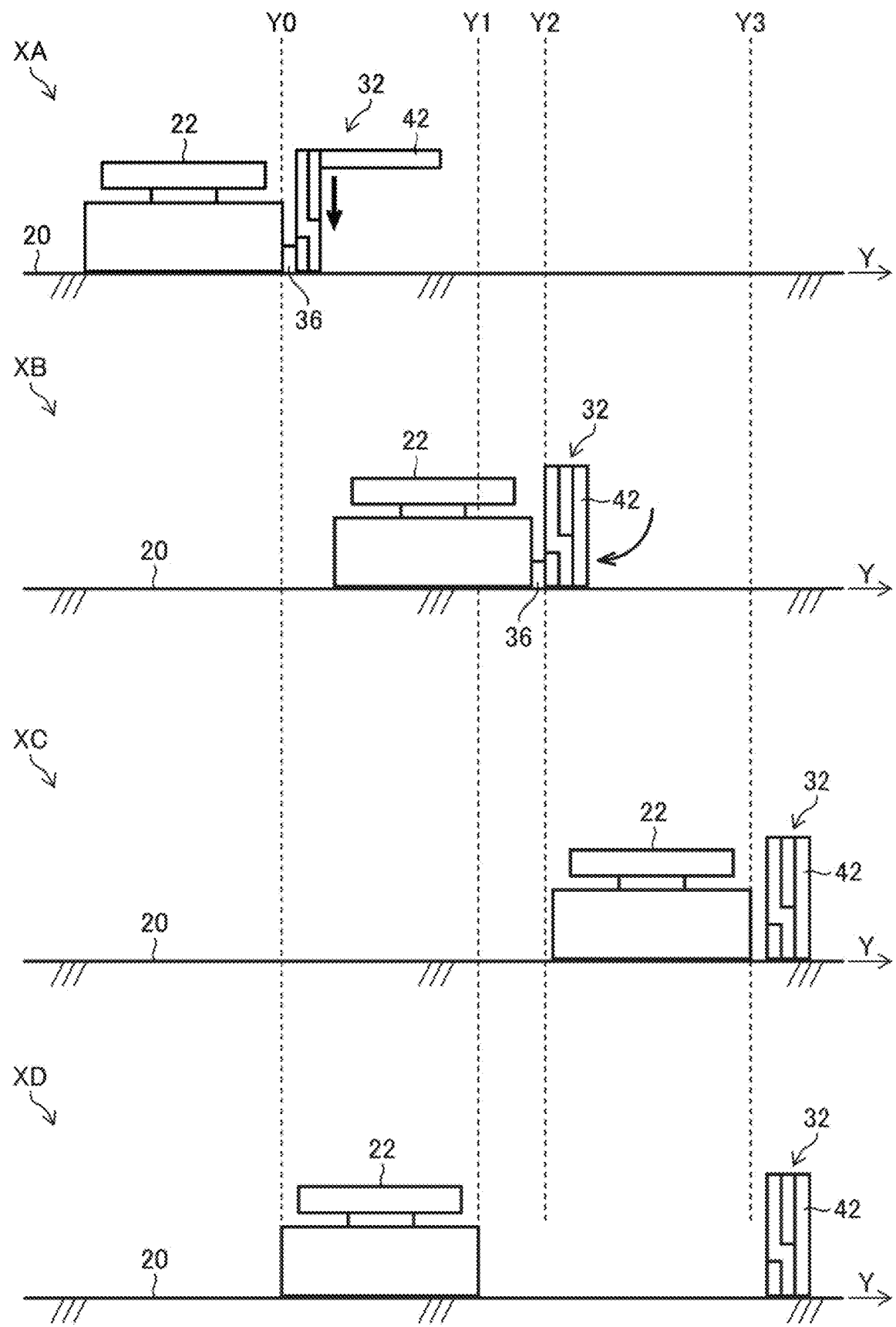
FIG. 10 is an explanatory view for illustrating the mounting processing when replacing the probe card.

FIGS. 9 and 10 are explanatory views for illustrating the mounting processing when replacing the probe card 30.

As shown by reference numeral 9A in FIG. 9, in a state where the new probe card 30 is held in the card holder 28 on the tray 42 set at the replacement position, the chuck moving mechanism 24 moves the chuck 22 to the separation/mounting position Y0 as shown by reference numeral 9B in FIG. 9. Accordingly, the tray 42, the probe card 30, and the card holder 28 are located (position-adjusted) to a position vertically below the card holding unit 26. Then, the card conveying mechanism 32 lifts the tray 42. As a result, the card holder 28 and the probe card 30 held on the tray 42 are also integrally lifted.

As shown by reference numeral 9C in FIG. 9, the card conveying mechanism 32 continuously lifts the tray 42 until the card holder 28 reaches the card holding unit 26 (holding position). Accordingly, the tray 42, the probe card 30, and the card holder 28 are conveyed from the replacement position to the holding position. In a case where this conveyance is completed, the card holding unit 26 holds the card holder 28. As a result, the new probe card 30 is mounted on the card holding unit 26 through the card holder 28.

As shown by reference character XA in FIG. 10, in a case where the card holding unit 26 holds the card holder 28, the card conveying mechanism 32 lowers the tray 42. As a result, the holding of the card holder 28 by the tray 42 is released.

As shown by reference character XB in FIG. 10, in a case where the lowering of the tray 42 is completed, the chuck moving mechanism 24 moves the chuck 22 to the tray switching position Y2. After this movement is completed, the card conveying mechanism 32 switches the tray 42 from the upright state to the laid state.

As shown by reference character XC in FIG. 10, after the tray 42 is switched to the laid state, the chuck moving mechanism 24 moves the chuck 22 to the coupling position Y3. Then, in a case where the coupling part 36 is housed in the chuck 22, the coupling between the chuck 22 and the card conveying mechanism 32 is released. As a result, the card conveying mechanism 32 is arranged at the replacement position before the start of the separation processing.

As shown by reference character XD in FIG. 10, in a case where the coupling between the chuck 22 and the card conveying mechanism 32 is released, the chuck moving mechanism 24 moves the chuck 22 to the inspection position Y1. This completes the mounting processing.

Figure 11:
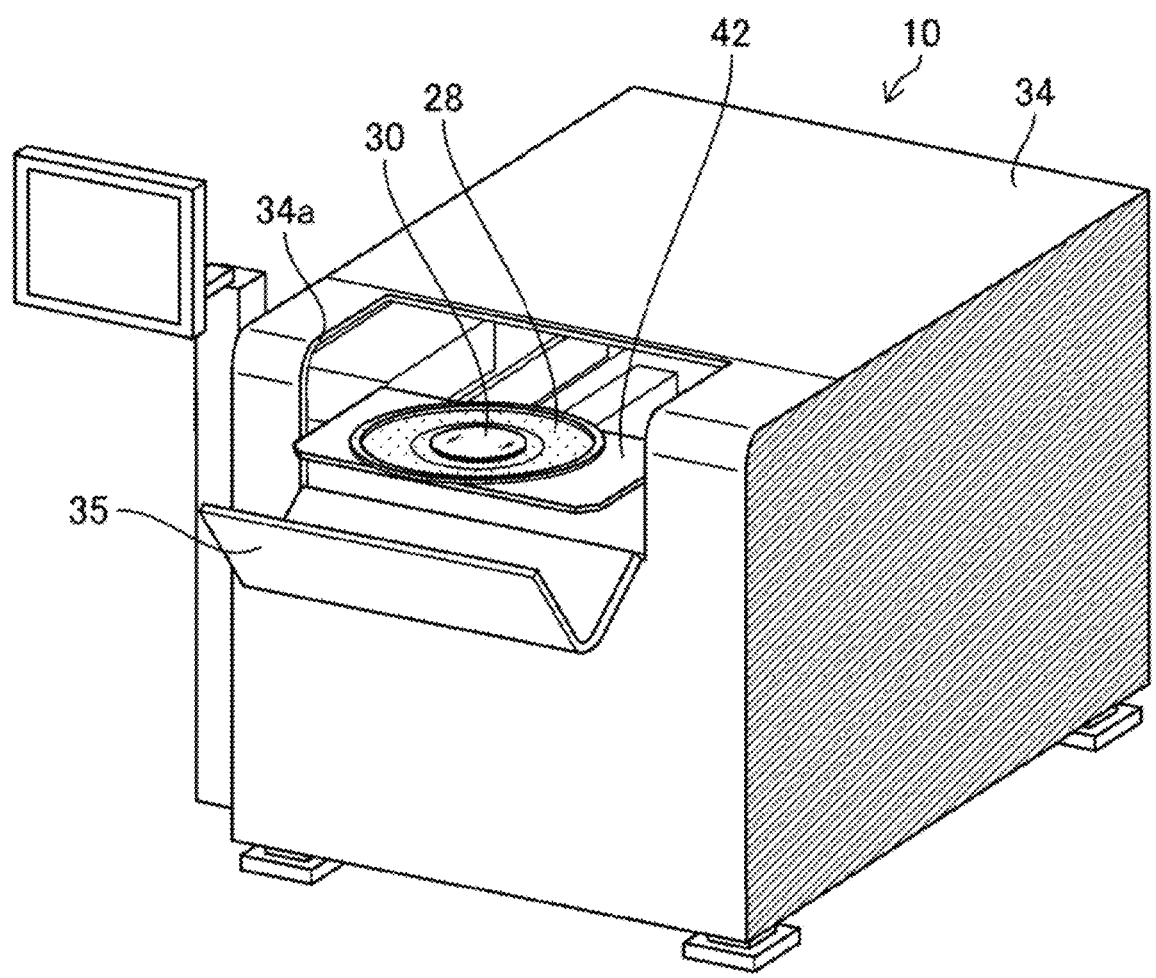
FIG. 11 is a perspective view of a door of a housing switched to an opened state.
Figure 12:
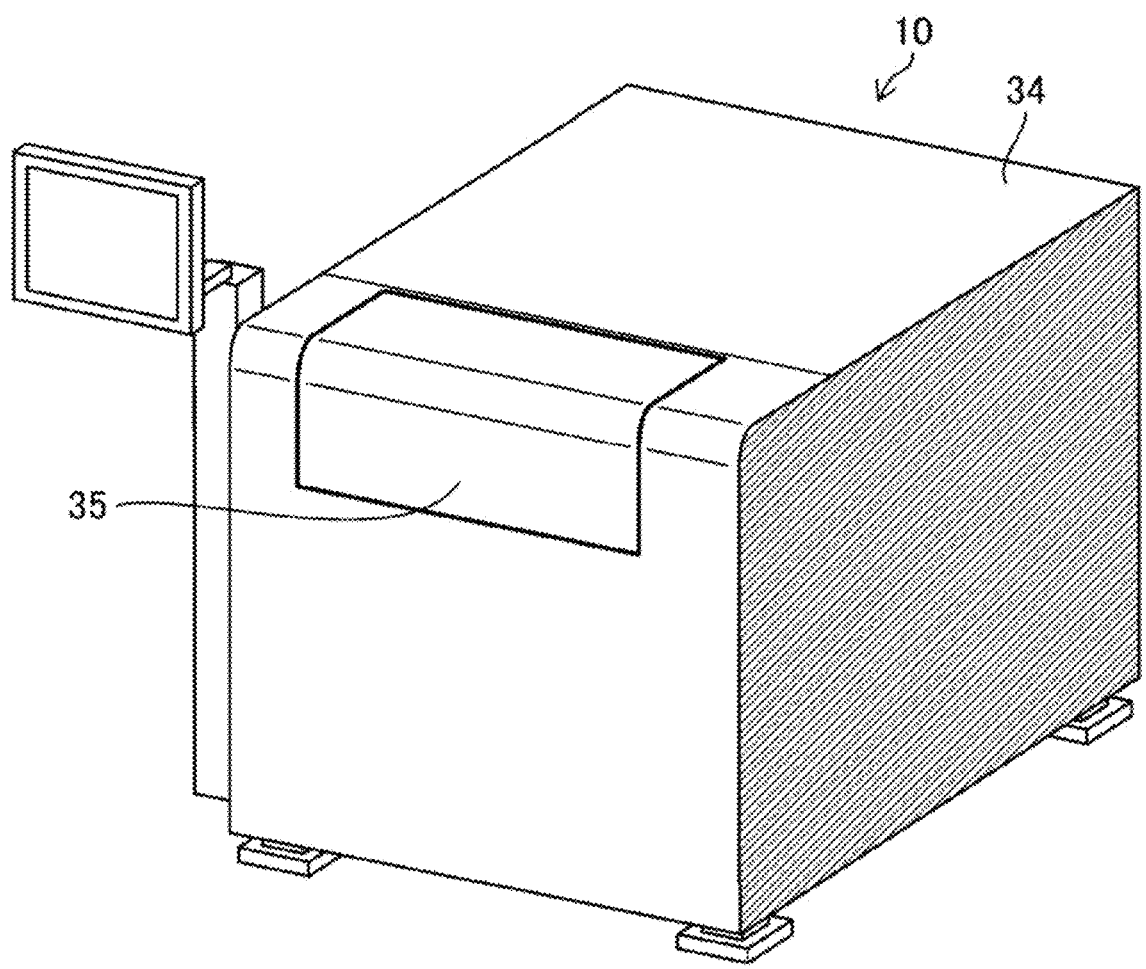
FIG. 12 is a perspective view of the door of the housing switched to a closed state.

FIG. 11 is a perspective view of the door 35 of the housing 34 switched to an opened state. FIG. 12 is a perspective view of the door 35 of the housing 34 switched to a closed state. As shown in FIGS. 11 and 12, the housing 34 has an opening part 34a formed so as to expose the replacement position, and more specifically, the tray 42 or the like that has been moved to the replacement position, to the outside. Here, in the present embodiment, part of the tray 42 or the like that has been moved to the replacement position protrudes to the outside of the housing 34 through the opening part 34a.

In the housing 34, the door 35 is turnably (pivotably) provided so as to be switchable between the opened state where the opening part 34a is opened (see FIG. 11) and the closed state where the opening part 34a is covered (see FIG. 12). The opening and closing of the door 35 are executed by a door operating mechanism 49 (see FIG. 16) including a publicly known actuator such as a motor. The door operating mechanism 49 switches the door 35 to the opened state before the tray 42 is moved to the replacement position during separation processing. The door operating mechanism 49 also switches the door 35 to the closed state after the tray 42 is housed in the housing 34 during mounting processing.

Laser Scanner

Figure 13:
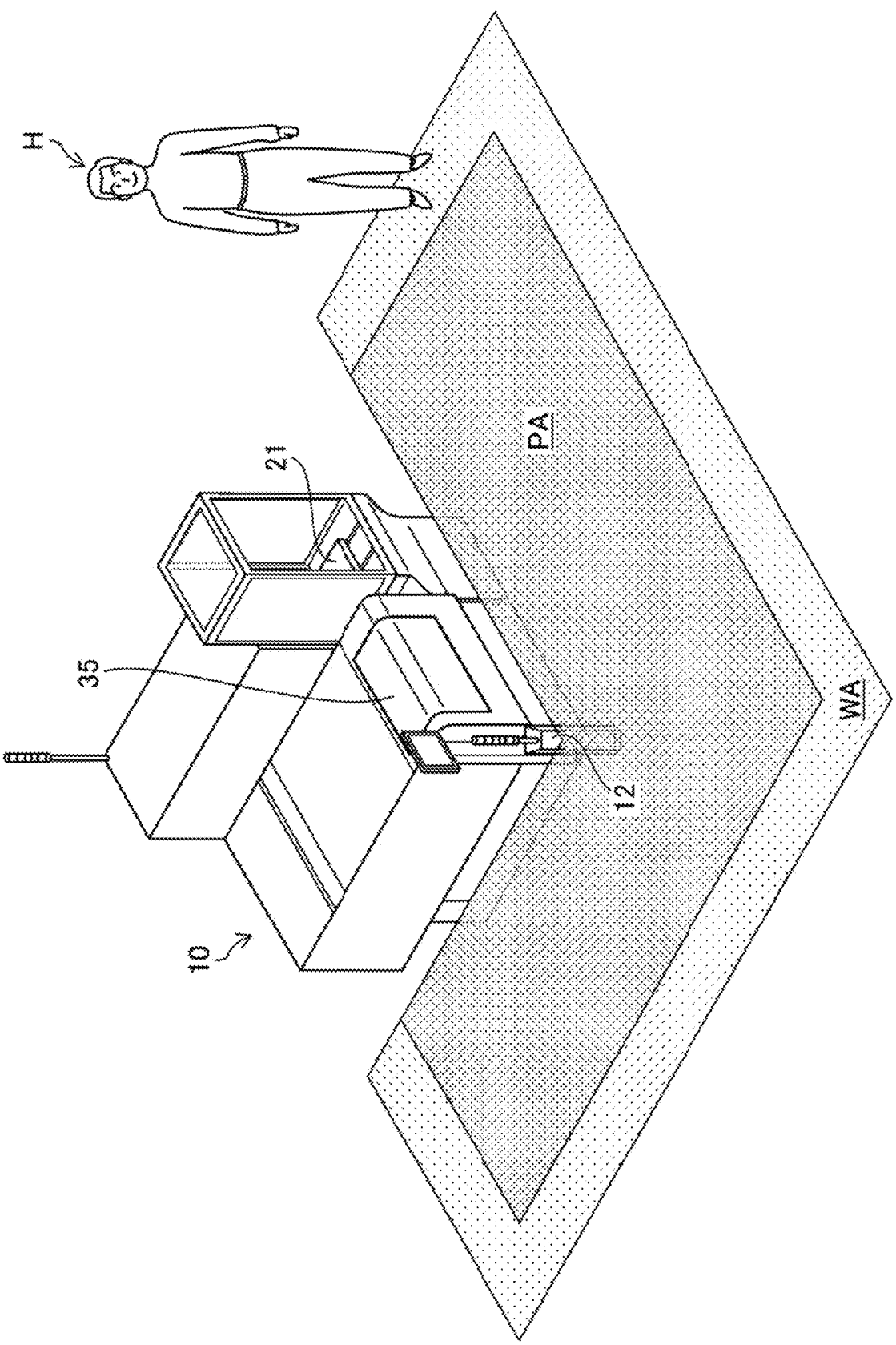
FIG. 13 is an explanatory view of a laser scanner.

FIG. 13 is an explanatory view of the laser scanner 12. As shown in FIGS. 13 and FIG. 1 described above, the laser scanner 12, which corresponds to the human detection sensor in the present invention, is arranged in the vicinity of the door 35 (opening part 34a) of the prober 10. For example, the laser scanner 12 emits and scans infrared laser light, and detects the infrared laser light hit and reflected by a person H, who is an object to be detected, so as to detect the distance to the person H. The installation position of the laser scanner 12 and a scanning range of the infrared laser light are adjusted so that it possible to detect the presence or absence of the person H intruding into a protected area PA and a warning area WA which are preset based on the replacement position and the position of the door 35.

The protected area PA is an area that defines a range where the person H may collide with the door 35 in opening and closing or a hand of the person H may be pinched by the door 35. That is, the protected area PA is a range dangerous for the person H if the person H intrudes into the range during opening and closing operation of the door 35.

The warning area WA is set outside the protected area PA. The warning area WA is an area to warn the person H who may intrude into the protected area. Note that the setting of the warning area WA may be omitted.

A detection signal output from the laser scanner 12 is input into the prober 10, and is further input into the GEM host 16 described later via the prober 10 and the network 18.

Wafer Conveying Mechanism

Figure 14:
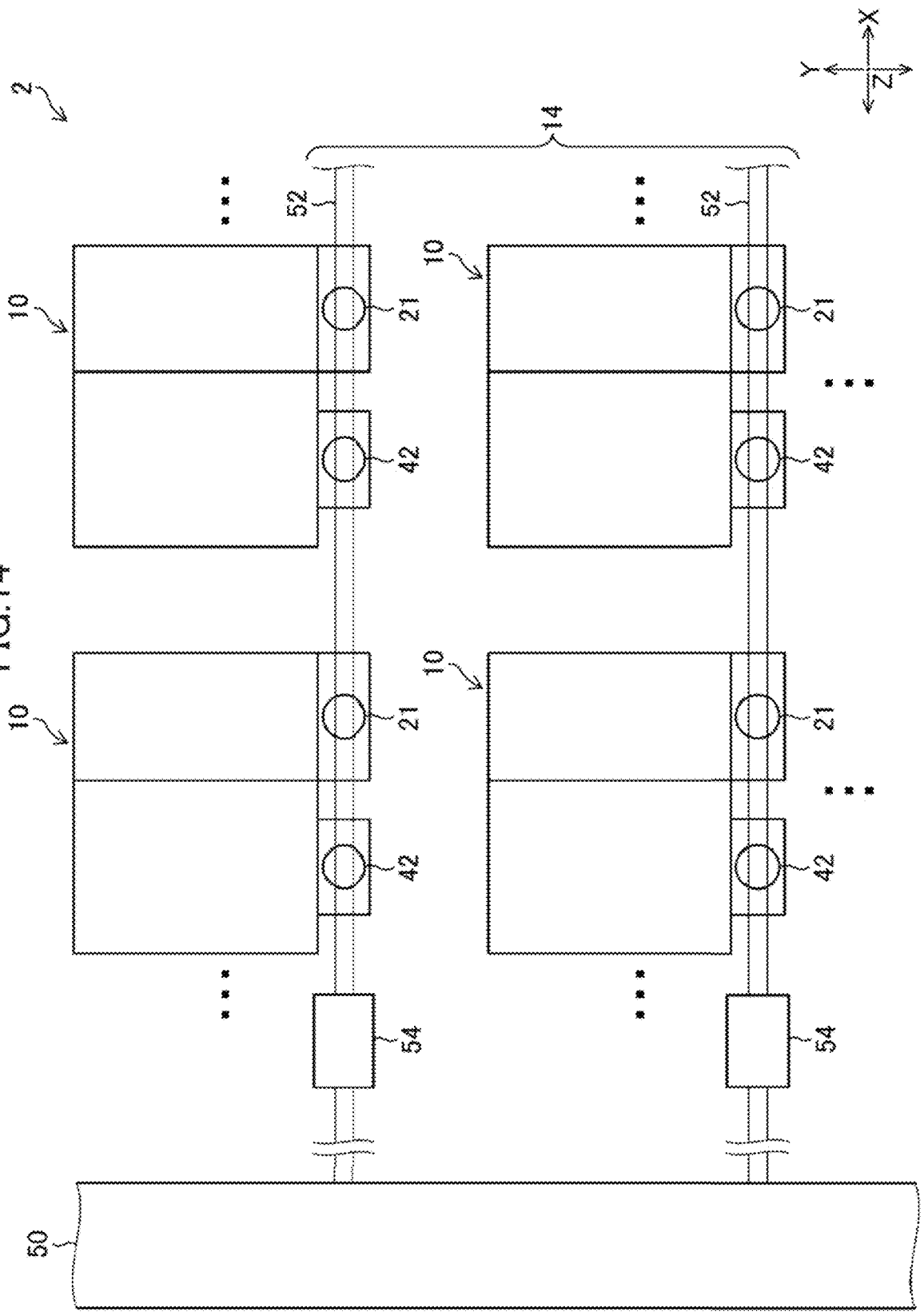
FIG. 14 is a schematic view of an OHT of a wafer conveying mechanism.

FIG. 14 is a schematic view of the OHT 54 of the wafer conveying mechanism 14. As shown in FIGS. 14 and FIG. 1 described above, the wafer conveying mechanism 14 conveys the cassette CS which houses the semiconductor wafers W, between the probers 10 two-dimensionally arranged in the XY directions and a prescribed storage 50 (see FIG. 1). Specifically, the wafer conveying mechanism 14 performs, for each of the probers 10, delivery (also referred to as "loading") of the cassette CS housing the semiconductor wafers W to be inspected to the prober 10, and withdrawal (also referred to as "unloading") of the cassette CS housing the inspected semiconductor wafers W from the prober 10.

The wafer conveying mechanism 14 includes: conveying rails 52; and the OHTs 54 that are overhead hoist transports. The conveying rails 52 each extend in the X direction and are arranged side by side in the Y direction on a ceiling in the semiconductor manufacturing process (illustration omitted). In other words, the conveying rails 52 are provided for each row of the probers 10 arranged in the X direction. More specifically, the conveying rails 52 are provided on the ceiling so that, in each row of the probers 10, the conveying rail 52 crosses the load port 21 of each of the probers 10 in a row, as viewed from above in the Z direction.

One end side of the conveying rails 52 is connected to the storage 50. The storage 50 stores the cassettes CS that each house the semiconductor wafers W to be inspected, and also stores various types of probe cards 30 corresponding to the types of semiconductor chips of the semiconductor wafers W. Note that the storage 50 that stores the cassettes CS and the storage 50 that stores the probe cards 30 may be provided at different locations from each other.

The OHT 54 is provided for each of the conveying rails 52, and travels along the corresponding conveying rail 52. Therefore, the OHTs 54 are movable in the X direction. Accordingly, for each row of the probers 10, the corresponding OHT 54 may move to a position directly above (including a position substantially directly above) the load port 21 of each of the probers 10. In addition, the OHTs 54 each include the lift holding unit 54a which is vertically movable in the Z direction (up-down direction) and whose position is adjustable in the Y direction.

When mounting and withdrawing the cassette CS on and from each of the load ports 21, the lift holding unit 54a releasably holds the cassette CS that houses the semiconductor wafers W.

When loading the cassette CS on the load port 21, the OHT 54 moves to the storage 50. Then, the lift holding unit 54a is lowered and the cassette CS is held with the lift holding unit 54a. Subsequently, after lifting the lift holding unit 54a which is holding the cassette CS, the OHT 54 moves to the position directly above the load port 21 of the prober 10 specified by the GEM host 16 described later. Then, after the OHT 54 lowers the lift holding unit 54a and the cassette CS is loaded on the load port 21, the OHT 54 releases the holding of the cassette CS by the lift holding unit 54a. This makes it possible to convey the cassette CS, that is, the semiconductor wafers W to be inspected, from the storage 50 to each of the load ports 21.

When withdrawing the cassette CS from the load port 21, the OHT 54 moves to the position directly above the load port 21 of the prober 10 from which the cassette CS is to be withdrawn by the OHT 54. Then, the lift holding unit 54a is lowered and the cassette CS loaded on the load port 21 is held by the lift holding unit 54a. Then, after lifting the lift holding unit 54a which is holding the cassette CS, the OHT 54 conveys the cassette CS to the storage 50. Then, after lowering the lift holding unit 54a to the storage 50, the OHT 54 releases the holding of the cassette CS by the lift holding unit 54a. This makes it possible to convey the cassette CS, that is, the inspected semiconductor wafers W, from the load port 21 to the storage 50.

The wafer conveying mechanism 14 may be used not only for loading and withdrawing the cassette CS, but also for replacing the probe card 30. Specifically, for each of the probers 10, the wafer conveying mechanism 14 performs: withdrawal processing of withdrawing the probe card 30 to be replaced from the tray 42 that is conveyed to the replacement position in the separation processing and conveying the probe card 30 to the storage 50; and delivery processing of delivering a new probe card 30 from the storage 50 to the tray 42 at the replacement position before performing the mounting processing. In this case, in each of the probers 10, the center position of the load port 21 and the replacement position of the tray 42 are adjusted to enable the withdrawal processing and the delivery processing of the probe card 30 by the wafer conveying mechanism 14.

Figure 15:
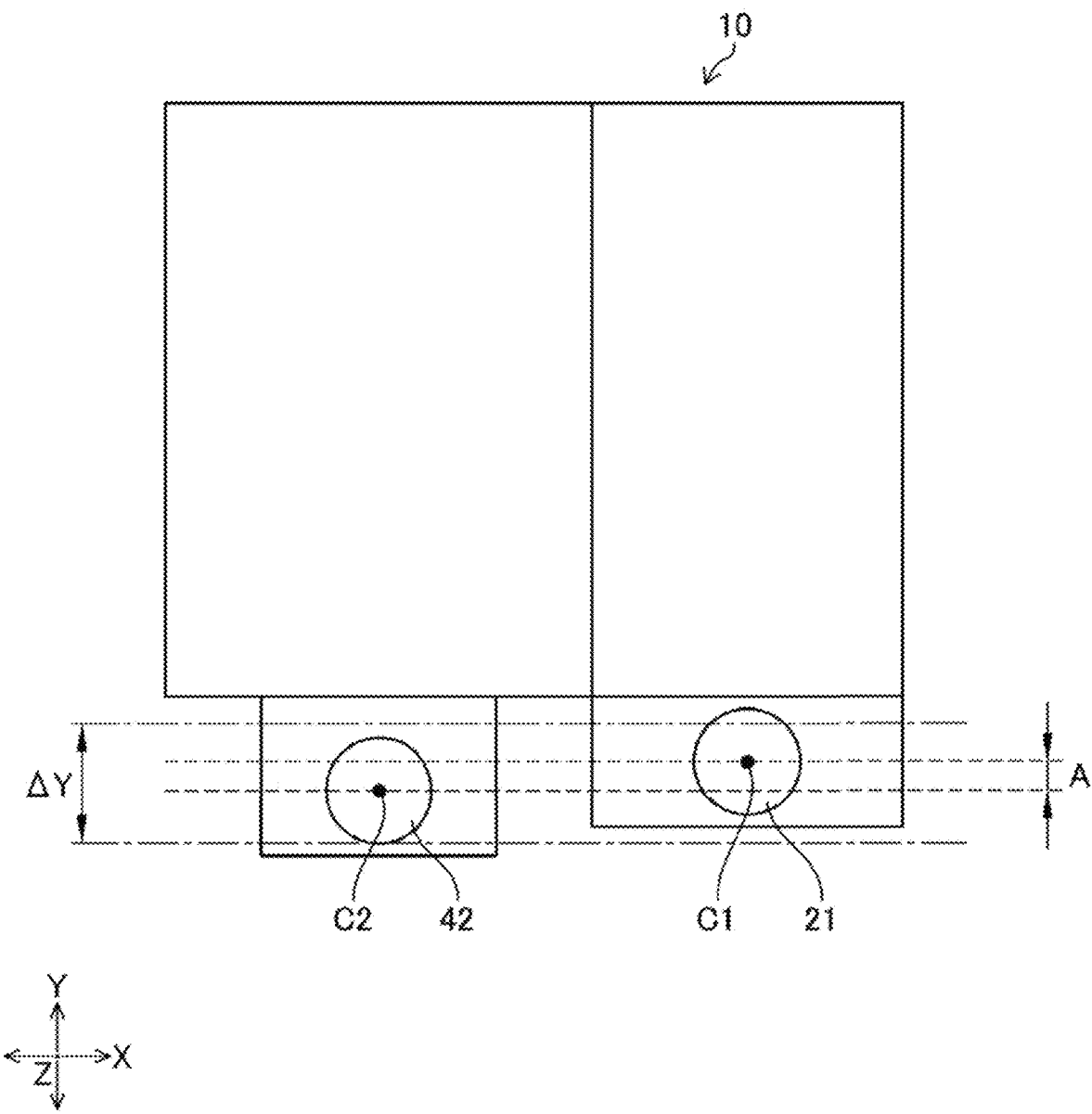
FIG. 15 is an explanatory view for illustrating conditions for enabling withdrawal processing and delivery processing of the probe card by the wafer conveying mechanism.

FIG. 15 is an explanatory view for illustrating conditions that enable the withdrawal processing and the delivery processing of the probe card 30 by the wafer conveying mechanism 14. Here, description is given with one prober 10 as an example.

As described above, because the OHT 54 moves along the conveying rail 52, the OHT 54 is movable in the X direction. While the position of the lift holding unit 54a of the OHT 54 is adjustable in the Y direction, its movable range ΔY is limited (for example, about ten or more mm). Moreover, when each of the probers 10 is installed in the semiconductor manufacturing process, installation errors in the XY directions may occur. Therefore, as shown in FIG. 15, in order to enable the withdrawal processing and the delivery processing of the probe card 30 by the wafer conveying mechanism 14, a center position C1 of the load port 21 and a center position C2 of the tray 42 (holder holding hole 44) set at the replacement position need to be arranged on a substantially the same straight line along the X direction, for each of the probers 10 in the same row.

Therefore, in the present embodiment, the center position C1 and the center position C2 in each of the probers 10 are adjusted and the installation position of each of the probers 10 is adjusted so that the center position C1 of each of the probers 10 is within a Y-directional movable range ΔY of the cassette CS held by the lift holding unit 54a and the center position C2 of each of the probers 10 is within a Y-directional movable range ΔY of the probe card 30 held by the lift holding unit 54a. Thus, the lift holding unit 54a may load the cassette CS on the load port 21 and load the probe card 30 at the replacement position, within movable ranges of the cassette CS and the probe card 30 in the Y direction. Note that as the installation position accuracy of each of the probers 10, that is, the position accuracy of the center position C1, is higher, a difference A between the center position C1 and the center position C2 can be made larger. Conversely, as the position accuracy of the center position C1 is lower, the difference A needs to be smaller.

In this way, for each row of the probers 10, the center position C1 and the center position C2 of each of the probers 10 in each row are arranged on a substantially straight line in the X direction, so that the position of the lift holding unit 54a of the OHT 54 may be adjusted to the position directly above the center position C2. Thus, it becomes possible to lower the lift holding unit 54a and hold the hold part 30b of the probe card 30 by the lift holding unit 54a. Accordingly, the OHT 54 may withdraw the probe card 30 to be replaced from the card holder 28 on the tray 42 or may load a new probe card 30 into the card holding hole 38 of the card holder 28 on the tray 42. As a result, it becomes possible for the wafer conveying mechanism 14 to perform the withdrawal processing and the delivery processing of the probe card 30.

Here, in the present embodiment, in order to hold the probe card 30 by the lift holding unit 54a of the OHT 54 that is used for replacement (withdrawal and loading) of the cassette CS, the hold part 30b of the probe card 30 is adjusted so as to have the shape and arrangement that can be held by the lift holding unit 54a. For example, the hold part 30b of the probe card 30 may be made in common with a hold part (illustration omitted) of the cassette CS.

Prober Control Unit

Figure 16:
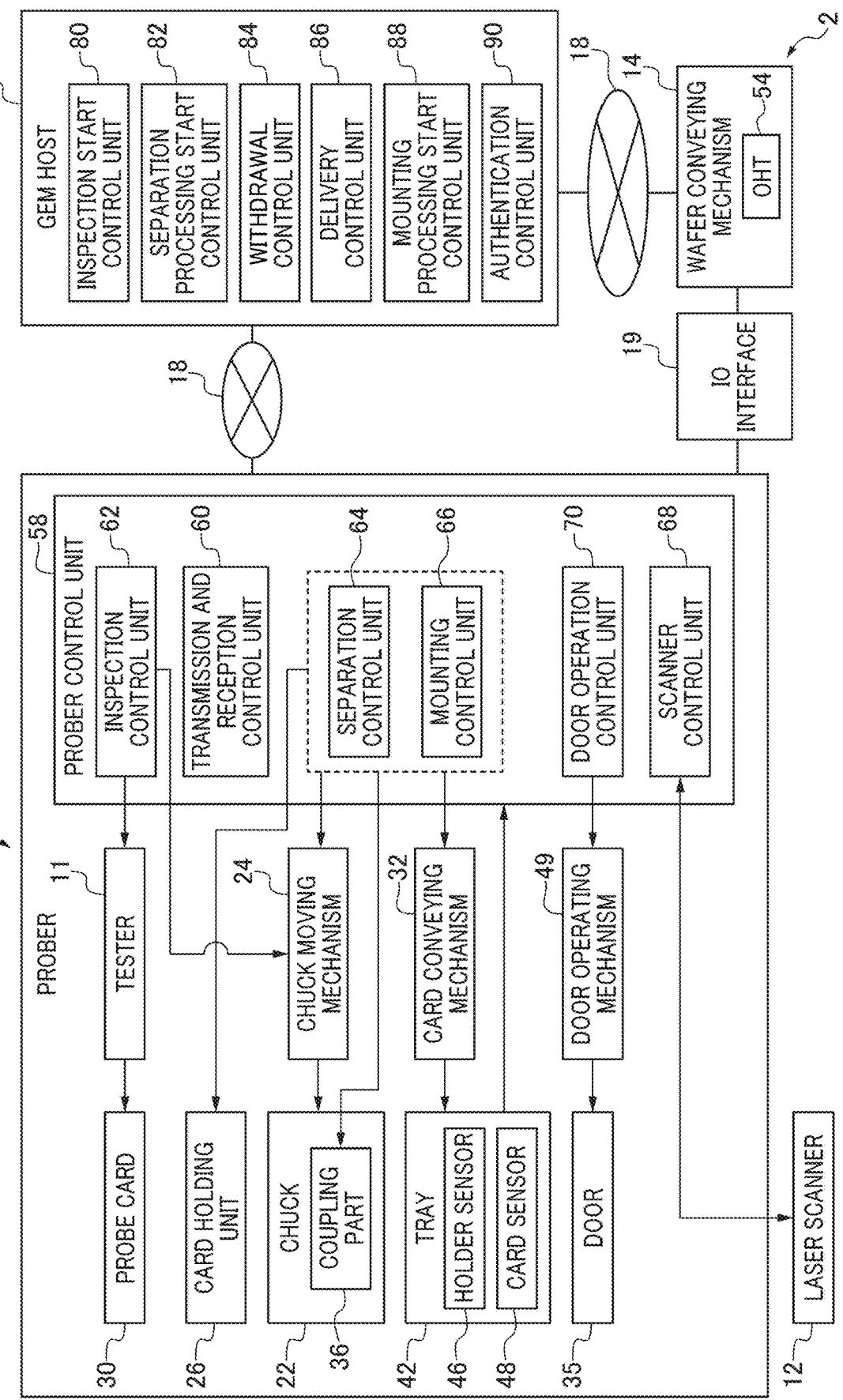
FIG. 16 is a functional block diagram of a prober control unit of the prober and a GEM host.

FIG. 16 is a functional block diagram of the prober control unit 58 of the prober 10 and the GEM host 16. As shown in FIG. 16, the prober 10 includes the prober control unit 58 in addition to each unit described above.

The prober control unit 58 comprehensively controls the operation of the prober 10 under the control of the GEM host 16 described later. The prober control unit 58 includes an arithmetic circuit having various processors (processors) and memories or the like. The various processors include a central processing unit (CPU), a graphics processing unit (GPU), an application specific integrated circuit (ASIC), and a programmable logic device (for example, a simple programmable logic device (SPLD), a complex programmable logic device (CPLD), and a field programmable gate arrays (FPGA)). Note that various functions of the prober control unit 58 may be implemented by one processor, or may be implemented by processors of the same type or the different types.

The prober control unit 58 is connected to the tester 11, the chuck moving mechanism 24, the card conveying mechanism 32, the holder sensors 46, the card sensors 48, and the door operating mechanism 49. Further, the prober control unit 58 is connected to the laser scanner 12 via an unillustrated connection interface. In addition, the prober control unit 58 is connected to the GEM host 16 via an unillustrated communication interface and the network 18.

The prober control unit 58 executes a control program read from an unillustrated storage unit to function as a transmission and reception control unit 60, an inspection control unit 62, a separation control unit 64, a mounting control unit 66, a scanner control unit 68, and a door operation control unit 70.

When replacing the probe card 30, the transmission and reception control unit 60 exchanges various information with the GEM host 16 via the network 18. For example, the transmission and reception control unit 60 receives a "replacement instruction" of the probe card 30 from the GEM host 16 before the start of the separation processing. After the separation processing is completed, the transmission and reception control unit 60 transmits a "replacement preparation complete notification" to the GEM host 16. After the delivery processing by the OHT 54 is completed, the transmission and reception control unit 60 receives a "start instruction of mounting processing" from the GEM host 16.

After the door 35 is switched to the closed state in the middle of the mounting processing, the transmission and reception control unit 60 transmits "read information" on the probe card 30 that is information read from the probe card 30 to GEM host 16 (see FIG. 31). The transmission and reception control unit 60 also receives an "authentication result" of the probe card 30 transmitted from the GEM host 16 in response to the transmission of the "read information". After the mounting processing is completed, the transmission and reception control unit 60 further transmits a "replacement complete notification" of the probe card 30 to the GEM host 16.

Furthermore, during delivery processing of the probe card 30 (during lifting and lowering of the lift holding unit 54a in particular), the transmission and reception control unit 60 outputs sensor output values of both the holder sensors 46 and the card sensors 48 to the GEM host 16. The output value of each sensor may be constantly output to the GEM host 16.

Furthermore, while the laser scanner 12 is in operation, the transmission and reception control unit 60 transmits the detection signal output from the laser scanner 12 to the GEM host 16 via the network 18. Note that, although the transmission and reception control unit 60 also exchanges various information (for example, an inspection instruction of the semiconductor wafer W, etc.) with the GEM host 16 at the timing other than the replacement of the probe card 30, detailed description of exchange of these information is omitted here since such exchange is publicly known technology.

The inspection control unit 62 controls the tester 11 and the chuck moving mechanism 24 under the control of the GEM host 16 to execute: positioning between the semiconductor wafer W held on the chuck 22 and the probe needles 30a; bringing the probe needles 30a in contact with the semiconductor chips of the semiconductor wafer W; and testing with the tester 11.

Under the control of the GEM host 16, the separation control unit 64 controls the chuck moving mechanism 24, the coupling part 36, the card conveying mechanism 32, and the card holding unit 26 to execute the separation processing shown in FIGS. 7 and 8 described above. After completion of the separation processing, the separation control unit 64 transmits the "replacement preparation complete notification" from the transmission and reception control unit 60 to the GEM host 16 via the network 18.

Under the control of the GEM host 16, the mounting control unit 66 controls the chuck moving mechanism 24, the coupling part 36, the card conveying mechanism 32, and the card holding unit 26 to execute the mounting processing shown in FIGS. 9 and 10 described above. The mounting control unit 66 also reads information on the probe card 30 by a publicly known method in the middle of the mounting processing, and causes the transmission and reception control unit 60 to transmit the "read information" to the GEM host 16 via the network 18. After the mounting processing is completed, the mounting control unit 66 further causes the transmission and reception control unit 60 to transmit the "replacement complete notification" to the GEM host 16 via the network 18.

During a period from the start of switching the door 35 to the opened state by the door operating mechanism 49 in the middle of the separation processing to the completion of switching the door 35 to the closed state by the door operating mechanism 49 in the middle of the mounting processing, the scanner control unit 68 uses the laser scanner 12 to continuously detect the presence or absence of a person H intruding into the protected area PA and the warning area WA. Note that the detection by the laser scanner 12 may be performed at all times.

In a case where the tray 42 is conveyed to the position in front of the door 35 in the middle of the separation processing, the door operation control unit 70 drives the door operating mechanism 49 to switch the door 35 from the closed state to the opened state. In a case where the tray 42 is housed in the housing 34 in the middle of the mounting processing, the door operation control unit 70 drives the door operating mechanism 49 to switch the door 35 from the opened state to the closed state.

During such opening and closing operation of the door 35 by the door operating mechanism 49, the door operation control unit 70 acquires a detection signal input from the laser scanner 12. Then, in a case where the person H intrudes into the protected area PA, the door operation control unit 70 stops driving of the door operating mechanism 49 based on the detection result of the laser scanner 12. As a result, the opening and closing operation of the door 35 may be stopped before the door 35 collides with the person or the hand (fingers) of the person is pinched.

While the person H intrudes into the protected area PA, the door operation control unit 70 continues to stop driving of the door operating mechanism 49. Then, the door operation control unit 70 restarts driving of the door operating mechanism 49 in response to switching from the presence to the absence of the person H intruding into the protected area PA based on the detection result of the laser scanner 12.

GEM Host

The GEM host 16 comprehensively controls the operation of the probers 10 and the OHTs 54. The GEM host 16 includes an arithmetic circuit having various processors and memories or the like. Note that various functions of the GEM host 16 may be implemented by one processor, and may be implemented by processors of the same type or the different types. As long as it is possible to comprehensively control the operation of the probers 10 and the OHTs 54, a control device other than the GEM host 16 may be used.

The GEM host 16 executes a control program read from the unillustrated storage unit to function as an inspection start control unit 80, a separation processing start control unit 82, a withdrawal control unit 84, a delivery control unit 86, a mounting processing start control unit 88, and an authentication control unit 90.

After the OHT 54 conveys the cassette CS from the storage 50 to the load port 21 of the prober 10, the inspection start control unit 80 outputs an inspection instruction of the semiconductor wafer W to the prober 10 via the network 18. The inspection instruction is input into the inspection control unit 62 via the transmission and reception control unit 60. Therefore, the inspection control unit 62 controls the tester 11 and the chuck moving mechanism 24 to execute testing of the semiconductor chips of the semiconductor wafer W.

The separation processing start control unit 82 outputs a replacement instruction of the probe card 30 to the transmission and reception control unit 60 of the prober 10 via the network 18 at prescribed replacement timing for replacing the probe card 30. The replacement instruction is input into the separation control unit 64 and the door operation control unit 70 via the transmission and reception control unit 60. Accordingly, the separation control unit 64 controls the chuck moving mechanism 24, the coupling part 36, the card conveying mechanism 32, and the card holding unit 26 to execute the separation processing. After the separation processing is completed, the separation control unit 64 causes the transmission and reception control unit 60 to transmit the "replacement preparation complete notification" to the GEM host 16. Moreover, the door operation control unit 70 drives the door operating mechanism 49 to switch the door 35 to the opened state in the middle of the separation processing.

Here, examples of the replacement timing of the probe card 30 may include: timing of switching the type of the semiconductor chips of the semiconductor wafer W to be inspected; a case where the probe card 30 has been used a prescribed number of times or more; and a case where an operator manually inputs the replacement instruction of the probe card 30 into the GEM host 16.

The withdrawal control unit 84 and the delivery control unit 86, which corresponds to the conveying control unit of the present invention, control the OHTs 54 of the wafer conveying mechanism 14 to execute conveyance between the replacement position of the probe card 30 and the storage 50.

When receiving the "replacement preparation complete notification" from the transmission and reception control unit 60 via the network 18, the withdrawal control unit 84 controls the OHT 54 to start the withdrawal processing. Specifically, the withdrawal control unit 84 sequentially executes: the processing of moving the OHT 54 to the position directly above the replacement position; the processing of lowering the lift holding unit 54a to the replacement position; the processing of holding the probe card 30 by the lift holding unit 54a, the processing of lifting the lift holding unit 54a; and the processing of conveying the probe card 30 to the storage 50 by the OHT 54.

After the withdrawal processing is completed, the delivery control unit 86 controls the OHT 54 to start delivery processing. Specifically, the delivery control unit 86 first executes the processing of conveying the probe card 30 corresponding to the semiconductor wafer W to be inspected from the storage 50 to the position directly above the replacement position by the OHT 54.

Next, based on the sensor output values of the card sensors 48 input from the transmission and reception control unit 60 via the network 18, the delivery control unit 86 performs: the processing of lowering the lift holding unit 54a to the replacement position (tray 42); and the processing of releasing the holding of the probe card 30 by the lift holding unit 54a. In this case, the delivery control unit 86 continues the lowering processing until the sensor output values of the card sensors 48 change, that is, until the card sensors 48 are pressed by the probe card 30. The delivery control unit 86 performs the processing of releasing the holding, in response to the change in sensor output values. Next, the delivery control unit 86 executes the processing of lifting the lift holding unit 54a.

Here, in a case where the state of the presence of the person H intruding into the protected area PA occurs based on the detection signal of the laser scanner 12 input from the transmission and reception control unit 60 via the network 18, the withdrawal control unit 84 and the delivery control unit 86 stop driving of the OHT 54, and more particularly, stop lifting and lowering of the lift holding unit 54a. Then, the withdrawal control unit 84 and the delivery control unit 86 stop the driving of the OHT 54 while the state of the presence of the person H intruding into the protected area PA continues, and restart the driving of the OHTs 54 in response to switching from the presence to the absence of the person H intruding into the protected area PA.

After the delivery processing is completed, the mounting processing start control unit 88 outputs a start instruction of the mounting processing of the probe card 30 to the prober 10. The start instruction is input into the mounting control unit 66 and the door operation control unit 70 via the transmission and reception control unit 60. Accordingly, the mounting control unit 66 controls the chuck moving mechanism 24, the coupling part 36, the card conveying mechanism 32, and the card holding unit 26 to execute the mounting processing, and also causes the transmission and reception control unit 60 to transmit the "read information" and the "replacement complete notification" to the GEM host 16. Moreover, the door operation control unit 70 drives the door operating mechanism 49 to switch the door 35 to the closed state in the middle of the mounting processing.

In a case where the "read information" on the probe card 30 is input via the network 18 from the transmission and reception control unit 60 during the mounting processing, the authentication control unit 90 authenticates the probe card 30 using a publicly known method, and transmits the authentication result to the transmission and reception control unit 60 via the network 18. The authentication result is input into the mounting control unit 66 via the transmission and reception control unit 60. Accordingly, the mounting control unit 66 continues the mounting processing in a case where the authentication result is correct, and stops the mounting processing in a case where authentication result is incorrect.

Operation of Wafer Test System

Figure 17:
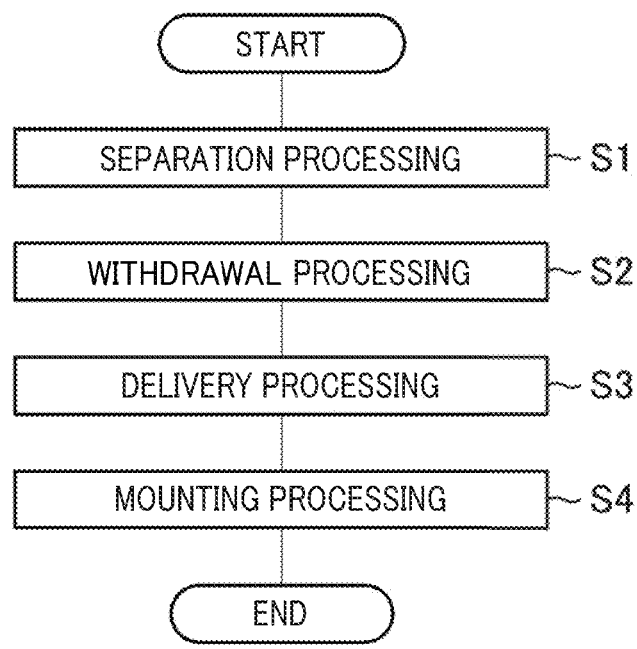
FIG. 17 is a flowchart showing the flow of replacement processing of the probe card of the prober performed in the wafer test system.

FIG. 17 is a flowchart showing the flow of the replacement processing of the probe cards 30 of the probers 10 performed in the above wafer test system 2 (corresponding to the method for replacing a probe card in the present invention). As shown in FIG. 17, in the case of replacing the probe cards 30 of the probers 10, a separation processing (step S1, corresponding to the separation step), a withdrawal processing (step S2, corresponding to the withdrawal step), a delivery processing (step S3, corresponding to the delivery step), and a mounting processing (step S4, corresponding to the mounting processing) are executed in sequence for each of the probers 10 under the control of the GEM host 16.

Separation Processing

FIGS. 18 to 23 are explanatory views for illustrating the separation processing in step S1 shown in FIG. 17. As shown in FIG. 18, at prescribed replacement timing of the probe card 30, the separation processing start control unit 82 outputs a replacement instruction T1 of the probe card 30 to the corresponding prober 10 via the network 18. The replacement instruction T1 is input into the separation control unit 64 and the door operation control unit 70 via the transmission and reception control unit 60 of the prober 10.

As shown in FIG. 19, the separation control unit 64 that has received the replacement instruction T1 controls the chuck moving mechanism 24, the coupling part 36, the card conveying mechanism 32, and the card holding unit 26 to start the separation processing. Accordingly, as shown in FIGS. 7 and 8 described above, the probe card 30 and the card holder 28 at the holding position are held on the tray 42, and then the chuck moving mechanism 24 conveys the tray 42 to the position in front of the door 35.

Meanwhile, as shown in FIG. 20, when the chuck moving mechanism 24 conveys the tray 42 to the position in front of the door 35, the door operation control unit 70 that has received the replacement instruction T1 drives the door operating mechanism 49 to switch the door 35 from the closed state to the opened state. In response to the start of switching, the scanner control unit 68 starts detection by the laser scanner 12, that is, detection of the presence or absence of the person H intruding into the protected area PA. The detection result of the laser scanner 12 is continuously input into the door operation control unit 70 and is also continuously input into the GEM host 16 from the transmission and reception control unit 60 via the network 18.

As shown in FIG. 21, while the person H intrudes into the protected area PA, the door operation control unit 70 stops driving of the door operating mechanism 49 based on the detection result of the laser scanner 12. This prevents the door 35 from colliding with the person H. Then, as shown in FIG. 22, in a case where the presence of the person H intruding into the protected area PA is switched to the absence of the person H, based on the detection result of the laser scanner 12, the door operation control unit 70 restarts driving of the door operating mechanism 49. This can reduce the time and efforts of the operator who performs restart operation.

As shown in FIG. 23, when the door 35 is switched to the opened state, the conveyance of the tray 42 by the chuck moving mechanism 24 is restarted, so that the chuck moving mechanism 24 conveys the tray 42 to the replacement position. As a result, the probe card 30 held by the card holder 28 on the tray 42 is also conveyed. After the conveyance is completed, the separation control unit 64 transmits the replacement preparation complete notification T2 from the transmission and reception control unit 60 to the GEM host 16 via the network 18. This completes the separation processing in step S1. Here, after the separation processing is completed, the transmission and reception control unit 60 continuously outputs the sensor output values of the card sensors 48 and the like to the GEM host 16 via the network 18.

Withdrawal Processing

FIGS. 24 to 25 are explanatory views for illustrating the withdrawal processing in step S2 shown in FIG. 17. As shown in FIG. 24, when the replacement preparation complete notification T2 is input via the network 18, the withdrawal control unit 84 of the GEM host 16 controls the OHT 54 of the wafer conveying mechanism 14 to sequentially execute: processing of moving the OHT 54 to the position directly above the replacement position of the prober 10; processing of lowering the lift holding unit 54a to the replacement position; and processing of holding the hold part 30b of the probe card 30 by the lift holding unit 54a. Then, as shown in FIG. 25, the withdrawal control unit 84 controls the OHT 54 to sequentially execute: processing of lifting the lift holding unit 54a which is holding the probe card 30; and processing of conveying the probe card 30 to the storage 50 by the OHT 54.

Here, in a case where the person H intrudes into the protected area PA, based on the detection result of the laser scanner 12 input from the transmission and reception control unit 60 via the network 18 during execution of each processing described above, the withdrawal control unit 84 stops driving of the OHT 54, and more particularly stops lifting and lowering of the lift holding unit 54a. This prevents the lift holding unit 54a from colliding with the person H. Then, in a case where the presence of the person H intruding into the protected area PA is changed to the absence of the person H, based on the detection result of the laser scanner 12, the withdrawal control unit 84 restarts the driving of the OHT 54. This can reduce the time and efforts of the operator who performs restart operation. This completes the withdrawal processing in step S2.

Delivery Processing

FIGS. 26 to 28 are explanatory views for illustrating the delivery processing in step S3 shown in FIG. 17. As shown in FIG. 26, when the withdrawal processing is completed, the delivery control unit 86 of the GEM host 16 controls the OHT 54 to move the OHT 54 to the storage 50. Then, the delivery control unit 86 causes the lift holding unit 54a to hold a new probe card 30 corresponding to the semiconductor wafer W to be inspected, and controls the OHT 54 to move the position directly above the replacement position.

Then, as shown in FIG. 27, the delivery control unit 86 lowers the lift holding unit 54a which is holding the probe card 30. At this time, based on the sensor output values of the respective card sensors 48 input via the network 18, the delivery control unit 86 continues the lowering processing of the lift holding unit 54a until the sensor output values change, that is, until the respective card sensors 48 are pressed by the probe card 30. Here, as described above, the card holder 28 on the tray 42 is provided with the positioning parts 40 (sec FIGS. 3 and 4) around the card holding hole 38. Accordingly, even when the position of the lift holding unit 54a are displaced in the XY directions (for example, about ±2 mm), the guide surface 40a of each of the positioning parts 40 guides the probe card 30 into the card holding hole 38, so that the probe card 30 is held in the card holder 28.

When the probe card 30 is held in the card holder 28, the sensor output values of the respective card sensors 48 change as described above. Thus, the delivery control unit 86 determines that the card holder 28 (tray 42) is switched from absence of the probe card 30 held thereon to presence of the probe card 30 held thereon. Then, the delivery control unit 86 stops the lowering processing of the lift holding unit 54a and releases the holding of the probe card 30 (hold part 30b) by the lift holding unit 54a. As a result, the new probe card 30 is conveyed from the storage 50 to the replacement position. Then, as shown in FIG. 28, the delivery control unit 86 lifts the lift holding unit 54a.

Here, while the person H intrudes into the protected area PA, based on the detection result of the laser scanner 12 input from the transmission and reception control unit 60 via the network 18 during delivery processing, the delivery control unit 86 stops driving of the OHT 54 as in the case of the withdrawal processing described above. The delivery control unit 86 restarts the driving of the OHT 54 in response to the person H leaving the protected area PA. This prevents the lift holding unit 54a from colliding with the person H. This completes the delivery processing in step S3.

Mounting Processing

FIGS. 29 to 34 are explanatory views for illustrating the mounting processing in step S4 shown in FIG. 17. As shown in FIG. 29, when the delivery processing is completed, the mounting processing start control unit 88 outputs a mounting instruction T3 of the probe card 30 to the prober 10 via the network 18. The mounting instruction T3 is input into the mounting control unit 66 and the door operation control unit 70 via the transmission and reception control unit 60 of the prober 10.

Then, the mounting control unit 66, which has received the mounting instruction T3, controls the chuck moving mechanism 24, the coupling part 36, the card conveying mechanism 32, and the card holding unit 26 to start the mounting processing. Accordingly, as shown in FIG. 9 described above, the chuck moving mechanism 24 and the card conveying mechanism 32 convey the tray 42 toward the holding position.

Meanwhile, as shown in FIG. 30, when the tray 42, which is conveyed to the holding position, is housed in the housing 34, the door operation control unit 70, which has received the mounting instruction T3, drives the door operating mechanism 49 to switch the door 35 from the opened state to the closed state. In this case, while the person H intrudes into the protected area PA, based on the detection result of the laser scanner 12, the door operation control unit 70 stops driving of the door operating mechanism 49. This prevents the door 35 from colliding with the person H, or prevents the hand or fingers of the person H from being pinched.

As shown in FIG. 31, after (or before) the door 35 is switched to the closed state, the mounting control unit 66 reads the information on the probe card 30 held in the card holder 28 on the tray 42, and causes the transmission and reception control unit 60 to transmit the read information T4 to the authentication control unit 90 of the GEM host 16 via the network 18. The authentication control unit 90 then authenticates the probe card 30 based on the read information T4 input via the network 18, and transmits the authentication result T5 to the mounting control unit 66 via the network 18 and the transmission and reception control unit 60. The mounting control unit 66 that has received the authentication result T5 continues the mounting processing in a case where the authentication result T5 is correct, and stops the mounting processing in a case where the authentication result T5 is incorrect.

Moreover when the authentication of the probe card 30 is completed, the scanner control unit 68 ends the detection with the laser scanner 12.

As shown in FIG. 32, when the mounting processing continues, the chuck moving mechanism 24 and the card conveying mechanism 32 convey the tray 42 to the holding position as shown in FIG. 9 described above, and then the card holding unit 26 holds the card holder 28. This completes the conveyance of the probe card 30 to the holding position, and the new probe card 30 is mounted on the card holding unit 26.

As shown in FIG. 33, when mounting of the new probe card 30 on the card holding unit 26 is completed, the chuck moving mechanism 24 moves the chuck 22 to the inspection position Y1 through processes including: lowering of the tray 42 by the card conveying mechanism 32; movement of the chuck 22 by the chuck moving mechanism 24; switching of the tray 42 to the laid state by the card conveying mechanism 32; and release of the coupling between the chuck 22 and the card conveying mechanism 32, as shown in FIG. 10 described above.

As shown in FIG. 34, when the movement of the chuck 22 to the inspection position Y1 is completed, the mounting control unit 66 transmits the replacement complete notification from the transmission and reception control unit 60 to the GEM host 16 via the network 18. This completes the mounting processing in step S4.

Thus, according to the present embodiment, the OHTs 54 of the wafer conveying mechanism 14 that load and withdraw the cassettes CS (semiconductor wafers W) of the probers 10 are used in the semiconductor manufacturing process to deliver and withdraw the probe cards 30 of the probers 10. Therefore, it is not necessary to provide a new facility for withdrawal and delivery of the probe cards 30 in the semiconductor manufacturing process. As a result, it is possible to automate the replacement of the probe cards 30 at a low cost while reducing an increase in the installation space in the semiconductor manufacturing process.

Others

The embodiment has been described using, as an example, a case where the separation processing is started in a state where the card holder 28 and the probe card 30 are held on the card holding unit 26. However, there may be a case where the separation processing is started in a state where the card holder 28 and the probe card 30 are not held on the card holding unit 26. In this case, in the separation processing (step S1), the processing shifts from the state shown by reference numeral 7C of FIG. 7 to the state shown by reference numeral 8C of FIG. 8. Then, the withdrawal processing (step S2) is omitted, and the delivery processing (step S3) and the mounting processing (step S4) are executed in sequence.

In the embodiment, the wafer test system 2 includes the probers 10. However, the number of the probers 10 may be one.

In the embodiment, in a case where the person H intrudes into the protected area PA, the opening and closing of the door 35 and the driving of the OHTs 54 are stopped based on the detection result of the laser scanner 12. However, warning (warning sound, warning indication, etc.) may be issued to the person H at the time when, for example, the intrusion of the person H into the warning area WA occurs.

In the embodiment, the laser scanner 12 is used to detect the presence or absence of the person H intruding into the protected area PA and the warning area WA. However, the presence or absence of the person H intruding into the protected area PA or the like may be detected using, for example, image analysis of images taken by a surveillance camera, or a variety of publicly known human detection sensors.

Although the embodiment has been described by taking the OHTs 54 as an example of the wafer conveying mechanism 14, a variety of publicly known wafer conveying mechanisms may be used, such as an automated guided vehicle (AGV), and an overhead shuttle (OHS) capable of conveying the cassette CS (or only semiconductor wafer W).

In the embodiment, the probe card 30 is conveyed between the storage 50 and the replacement position using the wafer conveying mechanism 14 for loading and withdrawing the cassettes CS (semiconductor wafers W). However, the probe card 30 may be conveyed between the storage 50 and the replacement position using a conveying mechanism installed separately from the wafer conveying mechanism 14.

REFERENCE SIGNS LIST

2 Wafer test system
10 Prober
11 Tester
12 Laser scanner
14 Wafer conveying mechanism
16 GEM host
18 Network
20 Base
21 Load port
22 Chuck
24 Chuck moving mechanism
26 Card holding unit
28 Card holder
30 Probe card
30a Probe needle
30b Hold part
32 Card conveying mechanism
34 Housing
34 Opening part
35 Door
36 Coupling part
38 Card holding hole
40 Positioning part
40a Guide surface
42 Tray
44 Holder holding hole
46 Holder sensor
48 Card sensor
49 Door operating mechanism
50 Storage
52 Conveying rail
54 Lift holding unit
58 Prober control unit
60 Transmission and reception control unit
62 Inspection control unit
64 Separation control unit
66 Mounting control unit
68 Scanner control unit
70 Door operation control unit
80 Inspection start control unit
82 Separation processing start control unit
84 Withdrawal control unit
86 Delivery control unit
88 Mounting processing start control unit
90 Authentication control unit
A Difference
C1 Center position
C2 Center position
CS Cassette
H Person
PA Protected area
T1 Replacement instruction
T2 Replacement preparation complete notification
T3 Mounting instruction
T4 Read information
T5 Authentication result
W Semiconductor wafer
WA Warning area
Y0 Mounting position
Y1 Inspection position
Y2 Tray switching position
Y3 Coupling position
$\Delta Y$ Movable range

What is claimed is:

1. A wafer test system, comprising:
a prober which includes a chuck that holds a semiconductor wafer and a probe card having probe needles thereon, and brings the probe needles in contact with semiconductor chips formed on the semiconductor wafer to inspect the semiconductor chips;

an overhead hoist transport which is movable along a conveying rail while holding a cassette that houses semiconductor wafers, and configured to deliver the cassette that houses semiconductor wafers to be inspected to the prober and withdraw the cassette that houses semiconductor wafers that have been inspected from the prober;

a conveying control unit configured to control the overhead hoist transport to convey the probe card between a replacement position of the probe card predetermined in the prober and a storage of the probe card located in a place different from the prober;

a card conveying mechanism which is provided to the prober, and configured to convey the probe card between a holding position where the probe card is held within the prober and the replacement position;

a separation control unit configured to control the card conveying mechanism to execute separation processing of conveying the probe card to be replaced from the holding position to the replacement position; and a mounting control unit configured to control the card conveying mechanism to execute mounting processing of conveying a new probe card from the replacement position to the holding position, wherein the prober includes:

a housing configured to house the chuck, the probe card, and the card conveying mechanism;

an opening part formed on the housing to expose the replacement position to outside of the housing;

a door switchable between an opened state where the opening part is opened and a closed state where the opening part is covered;

a door operating mechanism configured to switch the door between the opened state and the closed state; and a door operation control unit configured to drive the door operating mechanism to switch the door from the closed state to the opened state in the separation processing, and drive the door operating mechanism to switch the door from the opened state to the closed state in the mounting processing.

2. The wafer test system according to claim 1, comprising a human detection sensor configured to detect presence or absence of a person intruding into a protected area that is preset based on a position of the door, wherein the door operation control unit stops driving of the door operating mechanism while a person is intruding into the protected area based on a detection result by the human detection sensor.

3. The wafer test system according to claim 2, wherein in a case where driving of the door operating mechanism is stopped halfway, the door operation control unit restarts driving of the door operating mechanism in response to change of the detection result by the human detection sensor from the presence to the absence of a person intruding into the protected area.

4. The wafer test system according to claim 1, comprising a card holding unit configured to detachably hold the probe card at the holding position, wherein:

the card conveying mechanism includes a tray capable of holding the probe card, and is configured to convey the tray between the holding position and the replacement position;

the separation control unit sequentially executes, as the separation processing, processing of driving the card conveying mechanism to convey the tray to the holding position, processing of releasing holding of the probe card by the card holding unit to cause the tray to hold the probe card, and processing of driving the card conveying mechanism to convey the tray from the holding position to the replacement position; and in a case where the new probe card is held on the tray at the replacement position, the mounting control unit sequentially executes, as the mounting processing, processing of driving the card conveying mechanism to convey the tray from the replacement position to the holding position, and processing of causing the card holding unit to hold the probe card.

5. The wafer test system according to claim 1, wherein the prober includes a card holder that holds the probe card, and the card conveying mechanism integrally conveys the probe card and the card holder between the holding position and the replacement position.

6. The wafer test system according to claim 5, wherein:

the card holder includes a card holding hole that holds the probe card;

the overhead hoist transport loads the probe card in the card holding hole of the card holder at the replacement position;

the wafer test system comprises a plurality of positioning parts provided at an opening edge part which forms the card holding hole of the card holder; and each of the plurality of positioning parts has a guide surface configured to guide the probe card to the card holding hole in a case where the overhead hoist transport loads the probe card in the card holding hole.

7. The wafer test system according to claim 1, wherein:

the conveying control unit controls the overhead hoist transport to execute withdrawal processing of conveying the probe card to be replaced of the prober from the replacement position to the storage, and delivery processing of conveying the new probe card from the storage to the replacement position;

the wafer test system comprises a human detection sensor configured to detect presence or absence of a person intruding into a protected area that is preset based on the replacement position;

the conveying control unit stops the withdrawal processing during a state of the presence of a person intruding into the protected area, based on a detection result by the human detection sensor; and the conveying control unit stops the delivery processing during the state of the presence of the person intruding into the protected area, based on the detection result by the human detection sensor.

8. The wafer test system according to claim 1, wherein:

the conveying control unit controls the overhead hoist transport to execute withdrawal processing of conveying the probe card to be replaced of the prober from the replacement position to the storage, and delivery processing of conveying the new probe card from the storage to the replacement position;

the overhead hoist transport includes a lift holding unit configured to be vertically movable and detachably hold the cassette or the probe card;

the conveying control unit executes, as the withdrawal processing, processing of moving the overhead hoist transport to a position directly above the replacement position, processing of lowering the lift holding unit to the replacement position, processing of causing the lift holding unit to hold the probe card at the replacement position, processing of lifting the lift holding unit, and processing of moving the overhead hoist transport from the position directly above the replacement position to the storage; and the conveying control unit executes, as the delivery processing, processing of causing the lift holding unit to hold the probe card in the storage, processing of moving the overhead hoist transport from the storage to the position directly above the replacement position, processing of lowering the lift holding unit, processing of causing the lift holding unit to release holding of the probe card at the replacement position, and processing of lifting the lift holding unit.

9. The wafer test system according to claim 8, comprising a card conveying mechanism provided in the prober and configured to convey the probe card between the holding position where the probe card is held within the prober and the replacement position, wherein:

the card conveying mechanism includes a tray capable of holding the probe card, and configured to convey the tray between the holding position and the replacement position;

the wafer test system comprises a card sensor provided in the tray and configured to detect presence or absence of the probe card on the tray; and the conveying control unit executes processing of lowering the lift holding unit while the card sensor detects the absence of the probe card on the tray, and further executes processing of releasing holding of the probe card by the lift holding unit and lifting the lift holding unit in response to a detection result by the card sensor switching from the absence to the presence of the probe card on the tray.

10. The wafer test system according to claim 1, wherein:

the conveying rail extends in an X direction out of XYZ directions perpendicular to each other;

the overhead hoist transport includes a lift holding unit which is vertically movable in the Z direction and whose position is adjustable within a predetermined movable range in the Y direction, the lift holding unit configured to be capable of detachably holding the cassette or the probe card;

the prober includes a load port which is provided at a position different from the replacement position in the X direction and configured to be loaded with the cassette by the overhead hoist transport; and within the movable range of the lift holding unit in the Y direction, the lift holding unit is capable of loading the cassette on the load port and capable of loading the probe card at the replacement position.

11. A prober which includes a chuck that holds a semiconductor wafer and a probe card having probe needles thereon, and brings the probe needles in contact with semiconductor chips formed on the semiconductor wafer to inspect the semiconductor chips, the prober comprising:

a card conveying mechanism configured to convey the probe card between a holding position in the prober and a replacement position where the probe card is replaced;

a load port configured to be loaded with a cassette that houses semiconductor wafers by an overhead hoist transport that is movable along a conveying rail extending in an X direction out of XYZ directions perpendicular to each other and includes a lift holding unit which is vertically movable in the Z direction and whose position is adjustable within a predetermined movable range in the Y direction;

a housing configured to house the chuck, the probe card, and the card conveying mechanism;

an opening part formed on the housing to expose the replacement position to outside of the housing;

a door switchable between an opened state where the opening part is opened and a closed state where the opening part is covered;

a door operating mechanism configured to switch the door between the opened state and the closed state; and a door operation control unit configured to drive the door operating mechanism to switch the door from the closed state to the opened state in separation processing of conveying the probe card to be replaced from the holding position to the replacement position, and drive the door operating mechanism to switch the door from the opened state to the closed state in mounting processing of conveying a new probe card from the replacement position to the holding position, wherein:

within the movable range of the lift holding unit in the Y direction, the lift holding unit is capable of loading the cassette on the load port and capable of loading the probe card at the replacement position;

the probe card includes a hold part that is held by the lift holding unit; and the replacement position is a position where the probe card is replaceable by the overhead hoist transport.

* * * * *